United States Patent [19]
Ohsawa

[11] Patent Number: 6,075,746
[45] Date of Patent: *Jun. 13, 2000

[54] DRAM DEVICE WITH FUNCTION OF PRODUCING WORDLINE DRIVE SIGNAL BASED ON STORED CHARGE IN CAPACITOR

[75] Inventor: Takashi Ohsawa, Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/030,945

[22] Filed: Feb. 26, 1998

[30]     Foreign Application Priority Data

Feb. 28, 1997  [JP]  Japan ................................. 9-046818

[51] Int. Cl.$^7$ ...................................................... G11C 8/00
[52] U.S. Cl. ................................. 365/230.06; 365/189.09
[58] Field of Search ........................ 365/230.06, 189.09, 365/202, 189.11

[56]     References Cited

U.S. PATENT DOCUMENTS

| | | | |
|---|---|---|---|
| 5,612,924 | 3/1997 | Miyamoto | 365/233.5 |
| 5,619,162 | 4/1997 | Ogihara | 327/537 |
| 5,673,229 | 9/1997 | Okamura et al. | 365/201 |
| 5,706,245 | 1/1998 | Kim | 365/230.06 |
| 5,761,135 | 6/1998 | Lee | 365/189.11 |
| 5,825,714 | 10/1998 | Kohno | 365/230.06 |

*Primary Examiner*—Son Mai
*Attorney, Agent, or Firm*—Banner & Witcoff, Ltd.

[57]     ABSTRACT

A DRAM device includes plural cell arrays two-dimensionally arranged in column and row directions. A wordline driving section has a drive transistor in each row for transferring a charge to a corresponding cell in the plural cell arrays by raising a voltage on a wordline selected by a plural stage decode method. A first generating section generates a drive signal for driving a wordline which is supplied to the drive transistor, based on a stored charge in a capacitor. A second generating section generates a control signal for controlling the gate of the drive transistor in a chip of the DRAM device by a charge pump circuit.

29 Claims, 16 Drawing Sheets

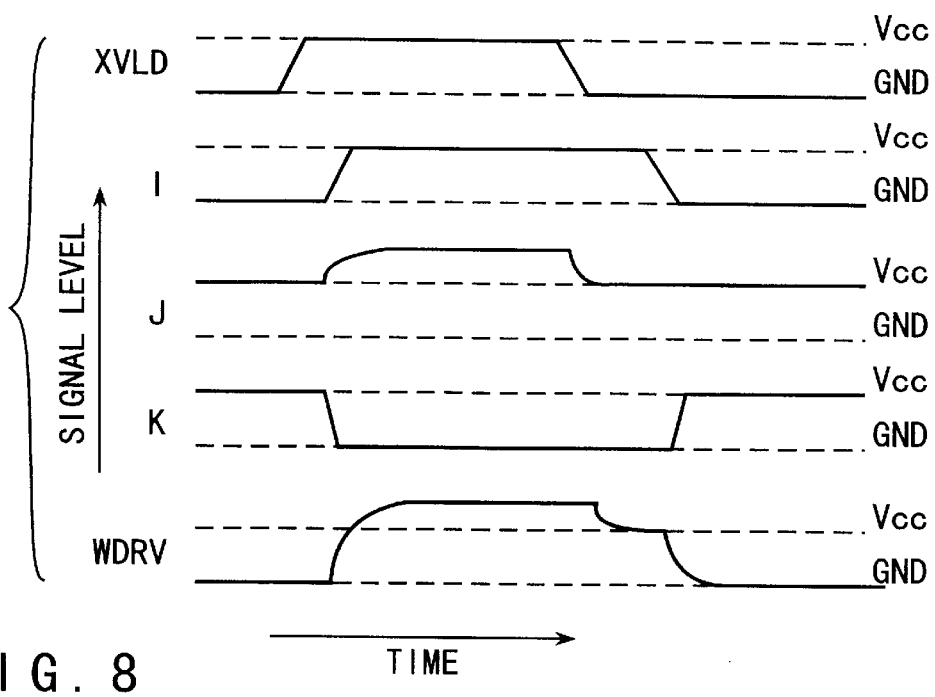
F I G. 8
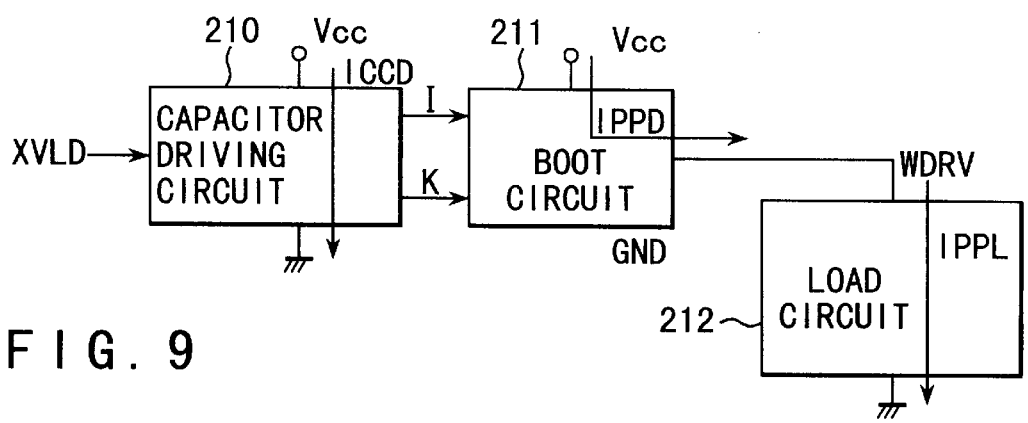
F I G. 9
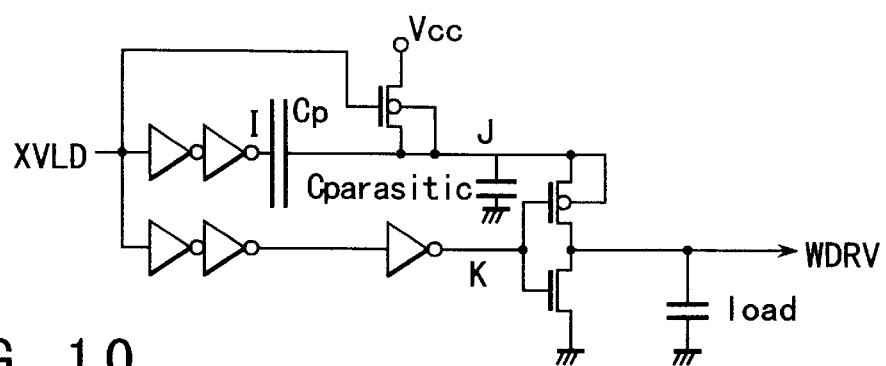
F I G. 10

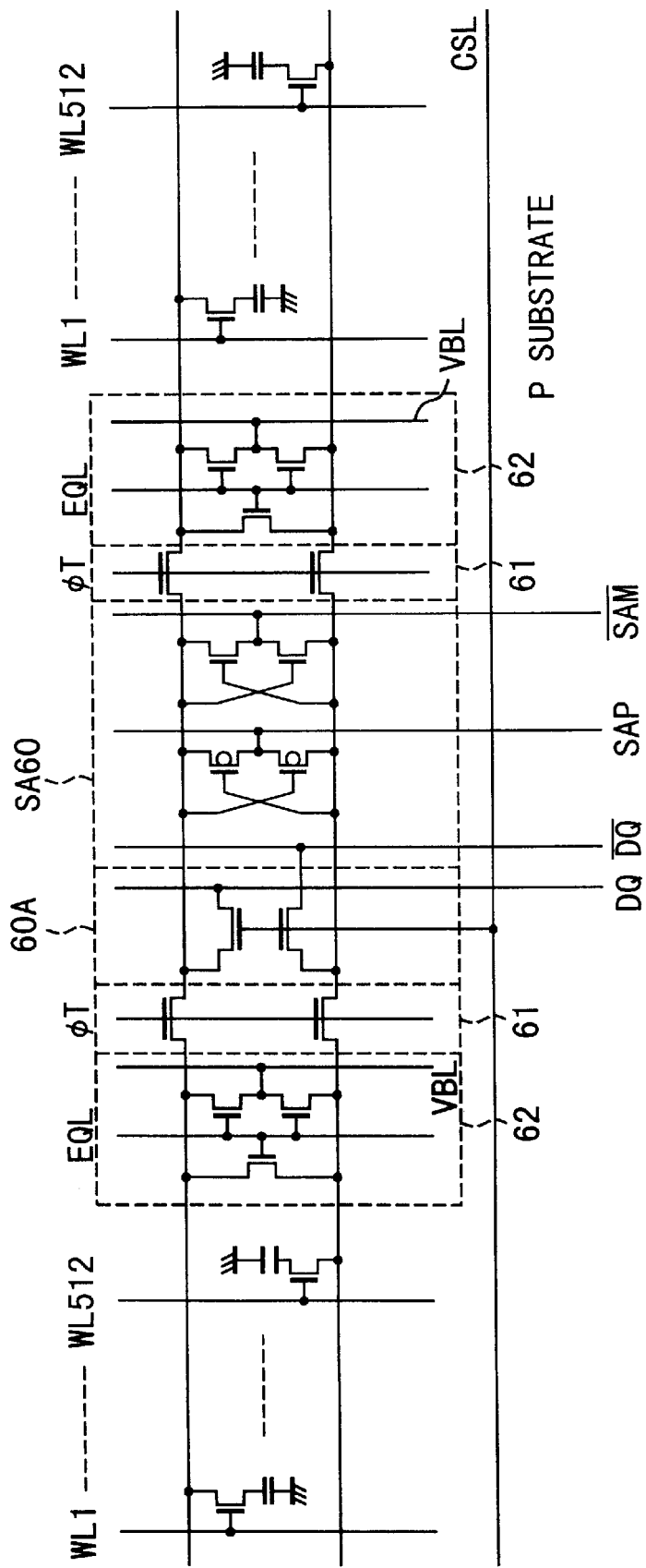
F I G. 12

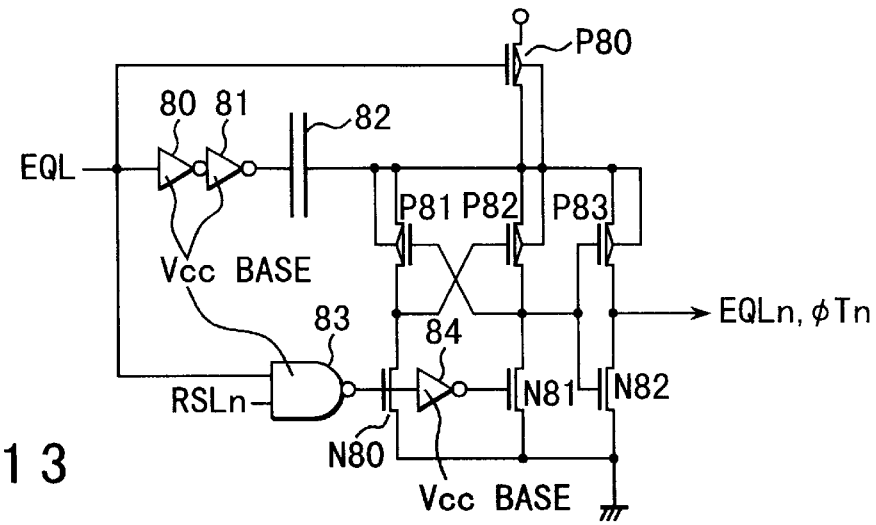
F I G. 13
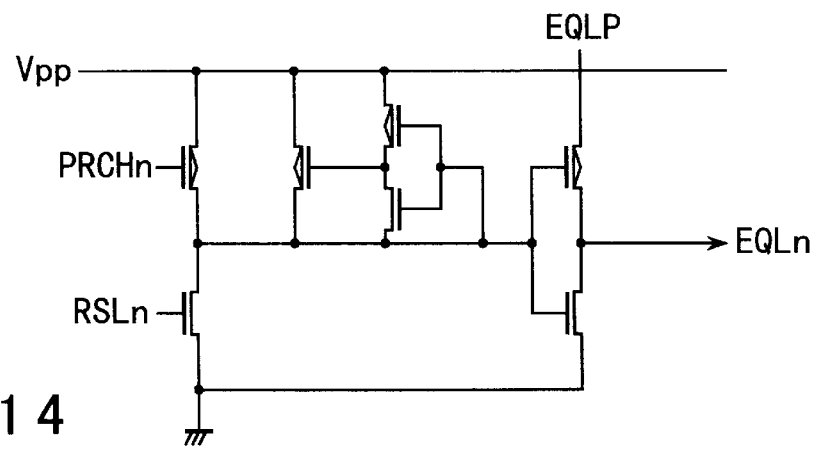
F I G. 14
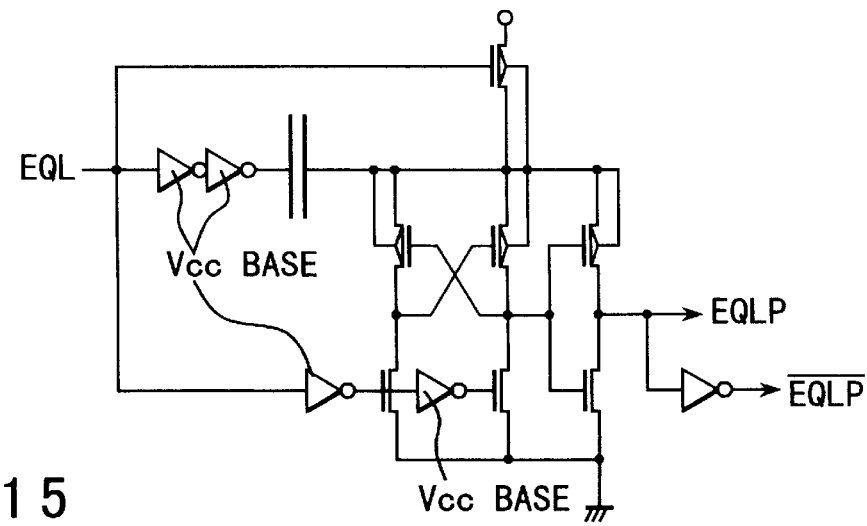
F I G. 15

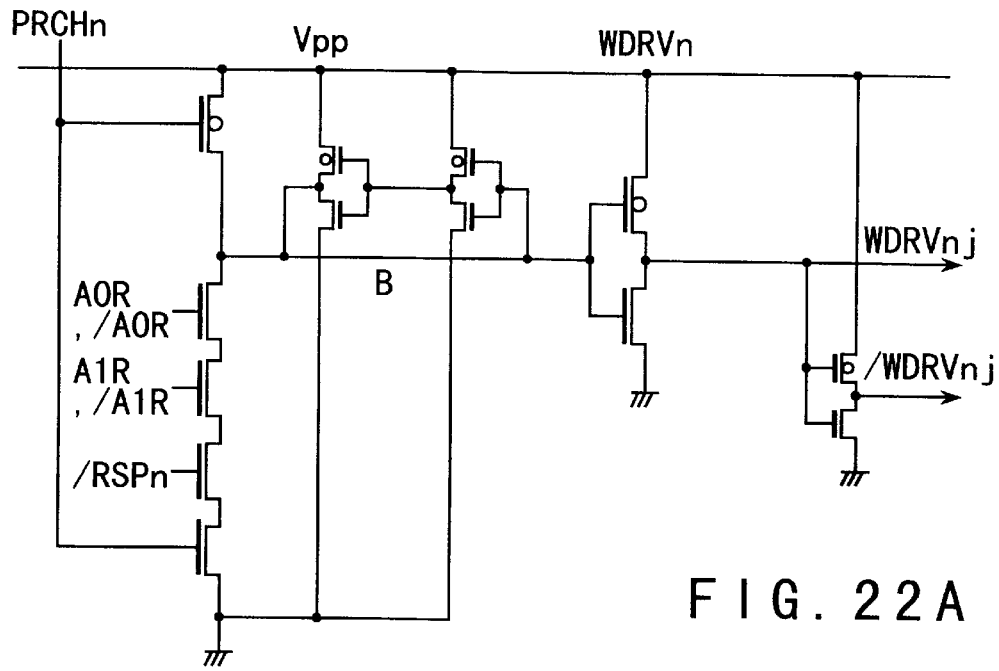
FIG. 22A
| WDRVn0 | /A0R | /A1R |
| WDRVn1 | A0R | /A1R |
| WDRVn2 | /A0R | A1R |
| WDRVn3 | A0R | A1R |
FIG. 22B
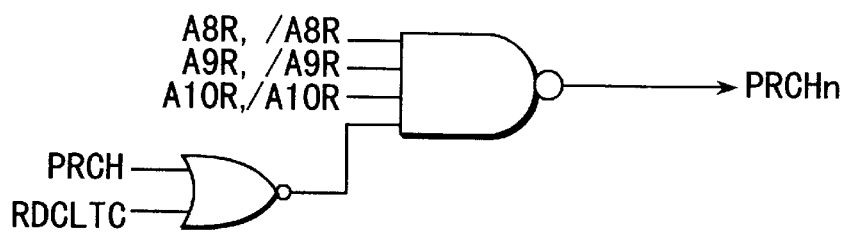
FIG. 22C { 1i: ROW DECODER
2i-j: WL DRIVER
3j: WDRVnj DRIVER }

DRAM DEVICE WITH FUNCTION OF PRODUCING WORDLINE DRIVE SIGNAL BASED ON STORED CHARGE IN CAPACITOR

BACKGROUND OF THE INVENTION

The present invention relates to a DRAM device and an LSI comprising the DRAM device and an LSI with a logic function in a mixed manner fabricated on the same chip.

Conventionally, two wordline driving methods for a DRAM device have been employed, which are:

(1) Two stage decode method using NMOS
(2) Vpp method using PMOS

First of all, (1) two stage decode method will be described. The two stage decode method is performed in the following manner. That is, in FIG. 24, one row decoder 1$i$ (i=0–63) is selected based on a combination of a precharge signal PRCHn and an address signal XA0–XA7, XB0–XB7. Then, when one WDRVnj driver 3$j$ (j=0–3) is selected based on a combination of a precharge signal PRCHn and an address signal A0R, A1R, one wordline driver (WL driver) 2$i$-$j$ (i=0–63, J=0–3) is selected in correspondence to the WDRVnj signal to finally drive one wordline WL. In FIG. 1, though a decoder corresponding to the WDRVnj driver 3$j$ is not shown, the decoder corresponding to the WDRVnj driver 3$j$ is actually provided.

FIG. 25 shows a constitution comprising a row decoder 10 corresponding to a row decoder 1$i$ shown in FIG. 24 and a WL driver 20-$m$ (m=0–3) corresponding to a WL driver 2$i$-$j$ (for example, i=0, j=0–3) shown in FIG. 24. WL drivers 20-$m$ are respectively connected to a wordline WLm.

In FIG. 25, a PMOS transistor P1, to whose gate a precharge signal PRCHn is input, and whose source is connected to a power supply Vcc, an NMOS transistor N1, to whose gate an address signal XAi is input, and an NMOS transistor N2, to whose gate an address signal XBj is input, and whose source is connected to the ground, are in series connected and inserted between the power supply Vcc and the ground. A connection point between the drain of the PMOS transistor P1 and the drain of the NMOS transistor N1 is connected with the drain of a PMOS transistor P2, whose source is connected to the power supply Vcc, the common gate between a PMOS transistor P3 and an NMOS transistor N3 in series connected with each other, the common gate between a PMOS transistor P4 and an NMOS transistor N4 connected in series with each other and the gate of an NMOS transistor N7 whose source is grounded.

The source of the PMOS transistor P2 is connected to the power supply Vcc and the gate thereof is connected to the common drain between the PMOS transistor P3 and the NMOS transistor N3 connected in series with each other. The sources of the NMOS transistors N3, N4 are grounded. The common drain between the PMOS transistor P4 and the NMOS transistor N4 is connected to the drain of the NMOS transistor N5. The gate of NMOS transistor N5 is connected to the power supply Vcc, and the source of the NMOS transistor N5 is connected to the gate of the NMOS transistor N6.

The NMOS transistor N6 and the NMOS transistor N7 are connected in series with each other. A WDRVn0 signal is input to the drain of the NMOS transistor N6 and the source of the NMOS transistor N7 is grounded. A wordline drive signal WL0 is obtained from a connection point between the source of the NMOS transistor N6 and the drain of the NMOS transistor N7.

In the above mentioned constitution, the PMOS transistors P1–P4, the NMOS transistors N1–N4 constitute a row decoder 10 and the NMOS transistors N5, N6, N7 constitute a WL driver 20-0.

Besides, the constitution further comprises: WL drivers 20-1, 20-2, 20-3, each of which has the same constitution as the WL driver 20-0, which is connected to the common drain between the PMOS transistor P4 and the NMOS transistor N4 and the common drain between the PMOS transistor P1 and the NMOS transistor N1, wherein a WDRVn1 signal, a WDRBn2 and a WDRVn3 signal are respectively input to the WL drivers 20-1, 20-2, 20-3.

FIG. 26 is a circuit diagram in which a WDRVnj driver shown in FIG. 24 is constructed with NMOS. Since this constitution is almost the same as the constitution shown in FIG. 25 in which the row decoder 10 and the WL driver 20-0 are combined, wherein address inputs XAj, XBj are only replaced with A0R, A0R bar A1R, A1R bar, detailed description is omitted.

An operational principle and operational limit of the above mentioned constitution will be described. Selection of a wordline is performed in two stages, one of which is a circuit shown in FIG. 26 in which a WDRVnj signal is generated from a WDRV signal and the other of which is a circuit shown in FIG. 25 in which one WL driver is selected by the WDRVnj signal and a wordline is finally selected.

In FIG. 25, when a precharge signal PRCHn is high and one row decoder (in this case row decoder 10) is selected by a predecoded address signal XAi and predecoded signals XB0–XB3, the drain of the NMOS transistor N5 is Vcc and a node A is charged to Vcc–Vth. Here, Vth is a threshold value of the NMOS transistor N5. This value is, by a back gate bias effect, increased higher than a value (at the lowest, on the order of 0.5V) when an ordinary source is GND and considered to be on the order of 1.5V, since the source is raised to Vcc–Vth. Thereafter, when Vcc=5V, the WDRVnj signal which is decoded at A0R, A1R of FIG. 26 and then is input to the drain of the NMOS transistor N6 for wordline driving of FIG. 25 is raised for 0 to 7.5V. In that case, the node A is raised from Vcc–Vth to as high as about 10V by a parasitic capacitance C1 between the drain and gate of the NMOS transistor N6 and WL0 is raised from 0 to 7.5V while Vth of the NMOS transistor N6 is held as it is. A circuit which generates a WDRVnj of FIG. 26 operates in absolutely the same principle.

While the above mentioned circuit almost normally operates at a high speed in a Vcc=5V system, there arises a case where an increasing speed of a wordline is lowered and thereby the wordline cannot be driven when Vcc is reduced to Vcc=3.3V. The reason why is that a charge voltage Vcc–Vth of the node A becomes smaller and thereby the node A is not sufficiently booted when a WDRVAnj signal is input. For example, when Vcc=3V as the worst condition (guarantee of operation is required at 3.3V±10%), if Vth= 1.5V in light of a back gate bias effect (Vth cannot be so much reduced in the case where increase in a standby current by a subthreshold current is considered even if Vcc is lowered), only Vcc=1.5V is allowed, the node A is raised from 1.5V to only about 4.5V, thereby a wordline cannot be raised to a desired 4.5V but only to 4.5–(Vth of the NMOS transistor N6)=4.5–1.5=3.0V and as a result the wordline cannot be driven in a normal state. In such a condition, an increasing speed of a wordline is also slowed by a great margin. As described above, it is understood that a wordline driving circuit of NMOS is a circuit which cannot be used in DRAM at a Vcc equal to or lower than 3.3V.

Then, (2) Vpp method using PMOS will be described, in which the problem encountered with the two stage method is overcome.

In FIG. 27, a PMOS transistor P5 to whose gate a precharge signal PRCHn is input, an NMOS transistor N11 to whose gate an address signal XAi is input and an NMOS transistor N12 to whose gate an address signal XBj is input are connected in series to one another and inserted between a power supply Vcc and the ground. The common drain between the PMOS transistor P5 and the NMOS transistor N11 is connected to the drain of a PMOS transistor P6 whose source is connected to the power supply Vpp, the common gate between a PMOS transistor P7 and an NMOS transistor N13, which are connected in series to each other, and the common gate between a PMOS transistor P8 and an NMOS transistor N14, which are connected in series to each other. The source of the PMOS transistor P7 is connected to the power supply Vpp and the source of the NMOS transistor N13 is grounded. The gate of the PMOS transistor P6 is connected to the common drain between the PMOS transistor P7 and the NMOS transistor N13.

WDRVn0 signal is input to the source of the PMOS transistor P8 and the source of the NMOS transistor N14 is grounded. The common drain between the PMOS transistor P8 and the NMOS transistor N14 is connected to the drain of an NMOS transistor N15, whose source is grounded, and to whose gate a WDRVn0 bar signal is input. A wordline drive signal WL0 is obtained from the common drain between the PMOS transistor P8 and the NMOS transistor N14.

The above mentioned the PMOS transistors P5, P6, P7 and NMOS transistors N11, N12, N13 constitute a row decoder 30 and the PMOS transistor P8 and the NMOS transistors N14, N15 constitute a WL driver 40-0.

The common drain between the PMOS transistor P5 and the NMOS transistor N11 is connected to: a WL driver 40-1, which has the same constitution as the WL driver 40-0, and which outputs a wordline drive signal WL1 by being input with WDRVn1 and a WDRVn1 bar signal; a WL driver 40-2, which outputs a word line drive signal WL2 by being input with WDRVn2 and a WDRVn2 bar signal; and a WL driver 40-3, which outputs a wordline driving signal WL3 by being input with WDRVn3 and a WDRVn3 bar signal.

FIG. 28 is a circuit diagram of the WDRVnj driver 3j constructed with PMOS. Since this constitution is almost the same as the constitution shown in FIG. 27 in which the row decoder 30 and the WL driver 40-0 are combined and constructed in such a manner that not only are the inputs XAi, XBj to the NMOS transistor N11, N12 of the row decoder 30 replaced with A0R (A0R bar) A1R (A1R bar) but also the NMOS transistor N15 is removed, description on the constitution is omitted here.

A method in which the power supply Vpp mentioned above is generated will be described. FIG. 29 is a circuit diagram showing a constitution of a charge pump circuit as a second generating means for generating the power supply Vpp.

In FIG. 29, a node B is connected to a node E through a capacitor C2, the node E is in turn connected to the drains of respective NMOS transistors N60, N61, N62, and the gate of an NMOS transistor N63. The gate of the NMOS transistor N60 is connected to an output node O and the source thereof is connected to a node G. The node G is connected to a node A through a capacitor C4 and the gate of the NMOS transistor N61. The source of the NMOS transistor N61 is connected to the output node O.

A node C is connected to a node F through a capacitor C3 and the node F is connected to the gate of the NMOS transistor N62, the source of the NMOS transistor N63 and the drains of the NMOS transistors N64, N65. The source of the NMOS transistor N62 and the drain of the NMOS transistor N63 are connected to the power supply Vcc. The gate of the NMOS transistor N65 is connected to the output node O, the source thereof is connected to a node H, and the node H is in turn connected to the gate of the NMOS transistor N64 and a node D through a capacitor C5. The source of the NMOS transistor N64 is connected to the output node O.

Moreover, the node B is connected to the NMOS transistors N60, N61, N62 and the node C is connected to the NMOS transistors N63, N64, N65.

An operational principle of the above mentioned charge pump circuit will be described in reference to a timing chart of FIG. 30.

A, B, C, D of FIG. 30 are input waveforms at the respective nodes A, B, C, D. With these inputs, E, F, G, H which are internal nodes in a circuit shown in FIG. 29, have functions to finally increase Vpp little by little while operating as shown in FIG. 30.

The timing chart is divided into two parts for facilitating a reader's understanding. The upper part is operations of the upper half of the circuit and the lower part is operations of the lower half thereof. Moreover, in order to further facilitate an understanding, the same Vpps are indicated in the respective parts. While the axes of A, B, C, D for the waveform are actually different from those of E, F, G, H and Vpp, the voltage axis (the axis of ordinate) in the latter cases is extended by a factor of 5 as compared to the former cases.

While only the operations of the upper part will be described here, those of the lower part are understood in a similar way.

When an input B is raised from GND to Vcc at a timing, the node E is biased from Vcc to a voltage which is determined by a coupling ratio thereof. In company with this, the node G is raised to Vpp−Vth (Vth is a Vth of the NMOS transistor N61), since a charge is supplied through the NMOS transistor N60. The node G is booted to be raised to a level (the highest potential) which is determined by the coupling ratio from the first Vpp−Vth when an input A is raised to Vcc from GND at a next timing. Thereby, all the charge in the node E is transferred to Vpp through the NMOS transistor N61. That is, the node E and Vpp are equalized. At this time, a voltage level of Vpp is raised.

When the input A is lowered from Vcc to GND in advance, a level of the node G is reduced due to coupling to cut off the NMOS transistor N61. Thereafter, when the input B is lowered in a similar way from Vcc to GND, not only is the node E reduced to a lower level due to coupling, but the node G is also reduced to the same level through the NMOS transistor N60. Therefore, the NMOS transistor N61 is perfectly cut off. Since the input C is thereafter raised, the node F of a pump in the lower side is raised and a charge flows into the node E from Vcc through the NMOS transistor N62.

If the above mentioned operations are repeated, a charge flowing in from Vcc is stored in the capacitors C2,C3 and discharged to Vpp in a next cycle.

If not only the pumps in the upper and lower sides are operated in a compensatory manner to increase an operational speed as a whole, but a voltage of the nodes F/E is also received from the counterpart, a path between Vcc and the node E/F can effectively assume an on or off state.

In the drive method, a DC potential, for example Vpp= 4.3V, is generated in the chip in the case of Vcc=3.3V using a charge pump circuit shown in FIG. 29 and a wordline is, by use of this, driven in a condition where Vth is not reduced by PMOS and the circuits of FIGS. 27 and 28 are operable even at a lower Vcc than 3.3V.

The charge pump circuit shown in FIG. 29, as described above, is a circuit which generates Vpp=4.3V from Vcc= 3.3V and it has two problems. One is that a current of consumption is large in its own circuit. A current equal to a load current theoretically flows in the pump circuit even when a pump efficiency is 100%, that is there is no loss. The reason why is that the capacitors C2, C3 are required to be charged with the same amount of a charge as that which is pumped up. However, as a matter of fact, there is no chance of 100% efficiency but normally at the current state the efficiency is on the order of 50%. The reason of no chance of 100% efficiency is that there is a requirement for a ring oscillator for periodical charge of the nodes A and B, which needs a current of consumption, and quite a large amount of parasitic capacitance is present with a current path in the pump, so that an excessive charge is required for the unnecessary capacitance.

There is a chance where sufficient charge is not stored when the pump is operated at a high speed for production of a current. Besides, there is another chance where a potential of a node is not raised to a sufficient value due to a parasitic resistance. Furthermore, there is still another chance of a leakage of a stored charge due to a subtle mismatch in a timing. Therefore, with superposition of the above mentioned factors, an efficiency of the pump is lowered to the order of 50%. In this case, a current consumed in the pump is twice as large as a Vpp load current and therefore an operational current of DRAM is a large current due to its original magnitude. If a device with a power supply voltage Vcc in the range of 2.5 to 1.8V hereafter appears, there arises a problem that a pump circuit cannot be operable. That is, since if the gate potentials of B, C which are NMOS transistors generating Vpp at a final stage, are not sufficiently boosted, a charge is not transferred. If Vcc is lowered, insufficient transferring results due to poor boosting.

BRIEF SUMMARY OF THE INVENTION

It is, accordingly, an object of the present invention to provide a DRAM device, which has a sufficient margin in operation even when a power supply voltage is reduced, and which consumes a smaller current.

In order to achieve the object, a DRAM device comprises:

plural cell arrays two-dimensionally arranged in column and row directions;

a wordline driving section having a drive transistor in each row for transferring a charge to a corresponding cell in the plural cell arrays by raising a voltage on a wordline selected by a plural stage decode method;

a first generating section for generating a drive signal for driving a wordline which is supplied to the drive transistor, the drive signal being generated based on a stored charge in a capacitor; and a second generating section for generating a control signal for controlling the gate of the drive transistor in a chip of the DRAM device by a charge pump circuit.

A DRAM device comprises:

plural cell arrays two-dimensionally arranged in column and row directions;

a wordline driving section having a drive transistor in each row for transferring a charge to a corresponding cell in the plural cell arrays by raising a voltage on a wordline selected by a plural stage decode method;

a bitline equalization signal driving section in which a bitline equalization signal is equalized by raising a voltage;

a first generating section for generating the bitline equalization signal based on a stored charge in a capacitor; and a second generating section for generating a control signal for controlling the gate of the drive transistor in a chip of the DRAM device by a charge pump circuit.

A DRAM device comprises:

plural cell arrays two-dimensionally arranged in column and row directions;

a wordline driving section having a drive transistor in each row for transferring a charge to a corresponding cell in the plural cell arrays by raising a voltage on a wordline selected by a plural stage decode method;

a bitline separation signal driving section for transferring a charge between a bitline and a sense amplifier by raising a voltage of a bitline separation signal;

a first generating section for generating a bitline separation signal based on a stored charge in a capacitor; and a second generating section for generating a control signal for controlling the gate of the drive transistor in a chip of the DRAM device by a charge pump circuit.

A DRAM invention comprises:

plural cell arrays two-dimensionally arranged in column and row directions;

a wordline driving section having a drive transistor in each row for transferring a charge to a corresponding cell in the plural cell arrays by raising a voltage on a wordline selected by a plural stage decode method;

a bitline equalization signal driving section for effecting equalization by raising a voltage of a bitline equalization signal;

a bitline separation signal driving section for transferring a charge between a bitline and a sense amplifier by raising a voltage of a bitline separation signal;

a first generating section for generating a drive signal for driving a wordline which is supplied to the drive transistor, the drive signal being generated based on a stored charge in a capacitor;

a second generating section for generating the bitline equalization signal based on a stored charge in a capacitor;

a third generating section for generating the bitline separation signal based on a stored charge in a capacitor; and a fourth generating section for generating a control signal for controlling the gate of the drive transistor in a chip of the DRAM device by a charge pump circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a timing chart showing operations at each node of the circuit of FIG. 7;

FIG. 9 is a view showing a circuit constitution for considering an efficiency of a boot circuit in an embodiment;

FIG. 10 is a view for illustrating a factor of reduction in efficiency in a boot circuit;

FIG. 12 is a view for illustrating a driving method for bitline equalization and bitline separation signals;

FIG. 13 is a view showing a driving circuit for bitline equalization and bitline separation signals;

FIG. 14 is a view showing a constitution for outputting an EQLn signal in another constitution of a driving circuit for bitline equalization and bitline separation signals;

FIG. 15 is a view showing a constitution for outputting an EQLP signal in another constitution of a driving circuit for bitline equalization and bitline separation signals;

FIGS. 22A to 22C are views showing a constitution of a circuit generating a WDRVnj signal, which is used in a burn-in test;

DETAILED DESCRIPTION OF THE INVENTION

Figure 1:
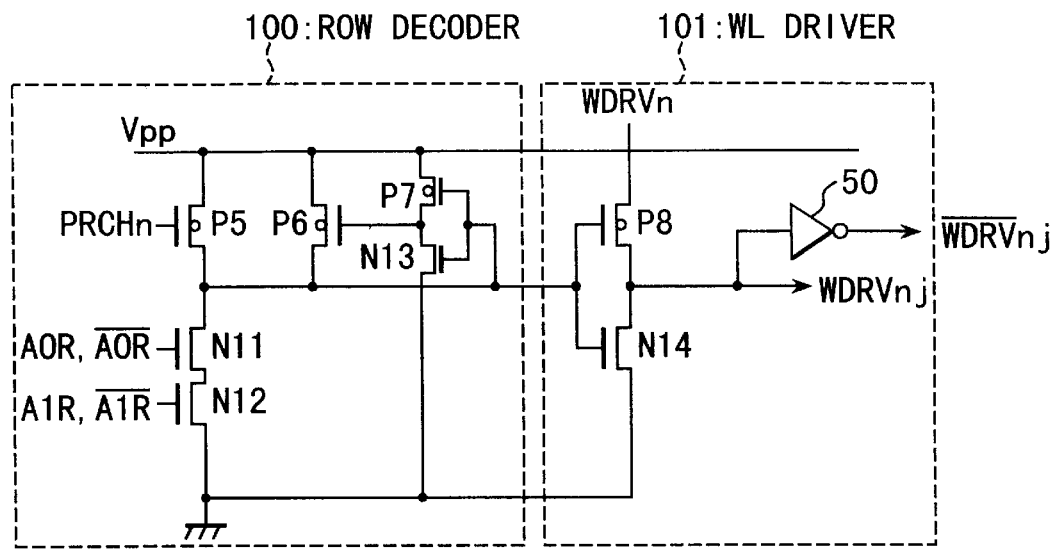
FIG. 1 is a view showing a circuit constitution for generating a WDRVnj signal in a DRAM device according to a first embodiment of the present invention.
Figure 2:
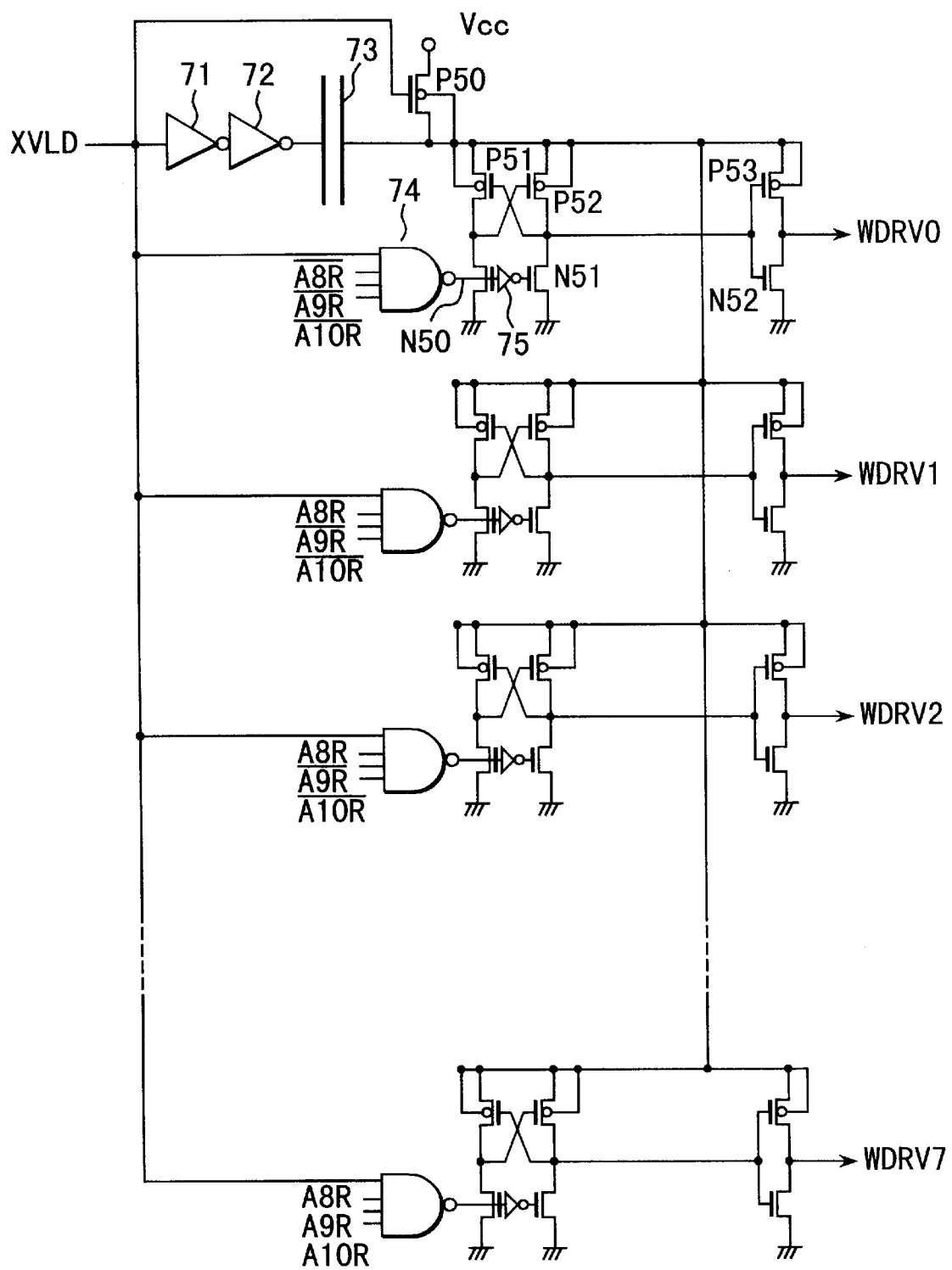
FIG. 2 is a view showing a circuit constitution for generating a WDRVn signal.
Figure 27:
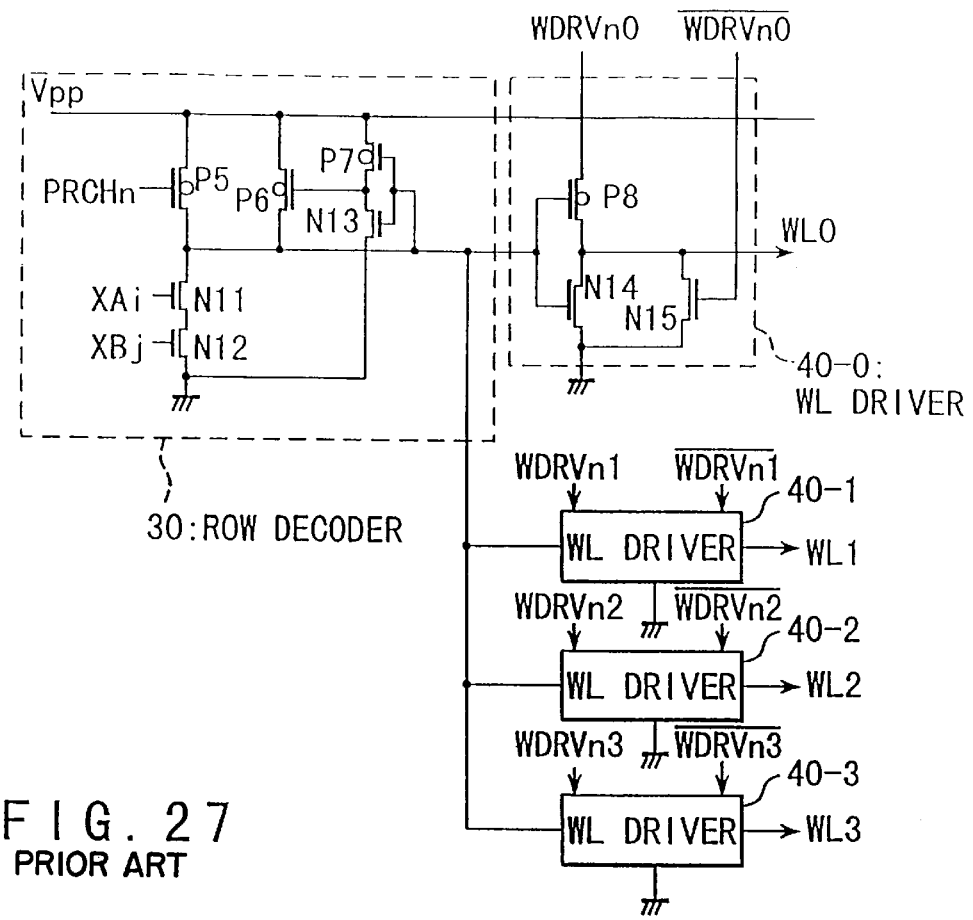
FIG. 27 is a view showing a constitution of a circuit for generating a signal for driving a specified wordline in a row decoder and a WL driver according to a second conventional technique.
Figure 28:
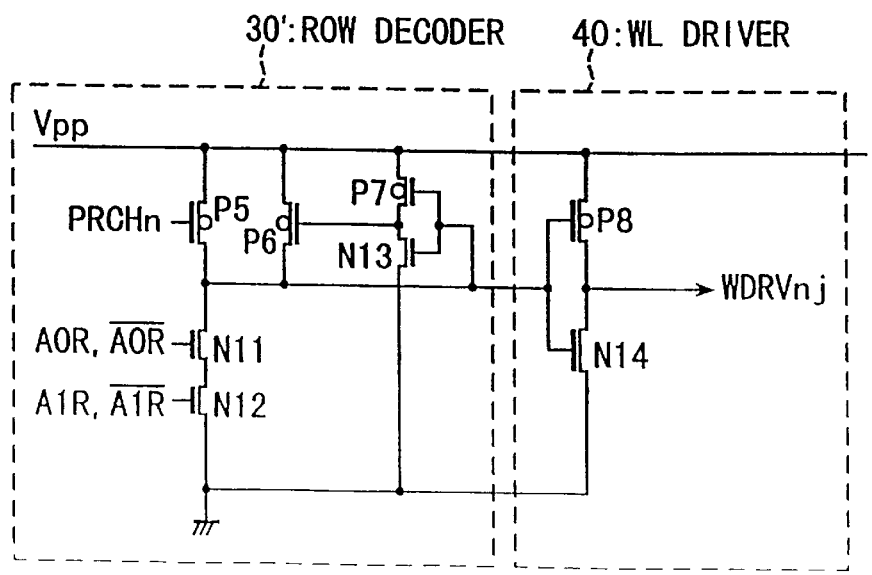
FIG. 28 is a view showing a constitution of a circuit for generating a WDRVnj signal in a row decoder and a WL driver according to the second conventional technique.

Embodiments of the present invention will, in a detailed manner, be described in reference to the accompanying drawing. FIG. 1 is a view showing a constitution of a decoder and a WL driver circuit according to a first embodiment of the present invention. In this constitution, the power supply Vpp is not connected to the source of the PMOS transistor P8 for wordline driving as shown in FIG. 28 which has been described above, but this constitution is the same as the constitution of FIG. 28 with the exception that a WDRVn signal generated in a boot circuit shown in FIG. 2 is supplied and an inverter 50 is disposed at the common drain between a PMOS transistor P8 and an NMOS transistor N14 through which common drain a WDRVnj signal is output. A circuit which finally drives one word line based on a generated WDRVnj signal is absolutely the same as the circuit of FIG. 27 which has been described above.

FIG. 2 is a circuit for generating the WDRVn signal and the WDRVn signal is generated by booting a stored charge in a capacitor. In FIG. 2, an XVLD signal which is an origin for generating WDRVn signal is input to the gate of a PMOS transistor P50 whose source is connected to Vcc, an inverter 71, and a NAND circuit 74 to which signals A8R bar, A9R bar, A10R bar are input. The inverter 71 is connected to the drain of the PMOS transistor P50 and the sources of PMOS transistors P51, P52, P53 through another inverter 72 and a capacitor 73. The gate of the PMOS transistor P51 is connected to the drain of the PMOS transistor P52, the gate of the PMOS transistor P53, the common gate between the PMOS transistor P53 and the NMOS transistor N52 connected in series to each other and the drain of the NMOS transistor N51. The NAND circuit 74 is connected to the NMOS transistor N50.

The drain of the PMOS transistor P51 is connected to the gate of the PMOS transistor P52 and the drain of the NMOS transistor N50. The source of the NMOS transistor N50 is grounded and the gate thereof is connected to the gate of the NMOS transistor N51 through an inverter 75. A WDRV0 signal is obtained from the common drain between the PMOS transistor P53 and the NMOS transistor N52.

A WDRVn signal generating circuit is a circuit, which is constructed in such a manner that the inverters 71, 72 and the capacitor 73 and the PMOS transistor P50 are removed from the above mentioned constitution, and in which circuit the XVLD input is commonly used and only rows corresponding to a combination of a logic state (in this case, 8 rows) among signals input to the NAND 74 are connected in series.

In such a manner, in the embodiment, a drive signal (WDRVn signal) for driving a wordline having a generally large load capacitance (about 5 picoF) is generated based on a stored charge in the capacitor 73 with use of the boot circuit as shown in FIG. 2 and at the same time a direct current voltage Vpp is generated by a charge pump in the chip of the DRAM device as a control signal for controlling the gate of a drive transistor in each row to be decoded by an address signal.

Figure 29:
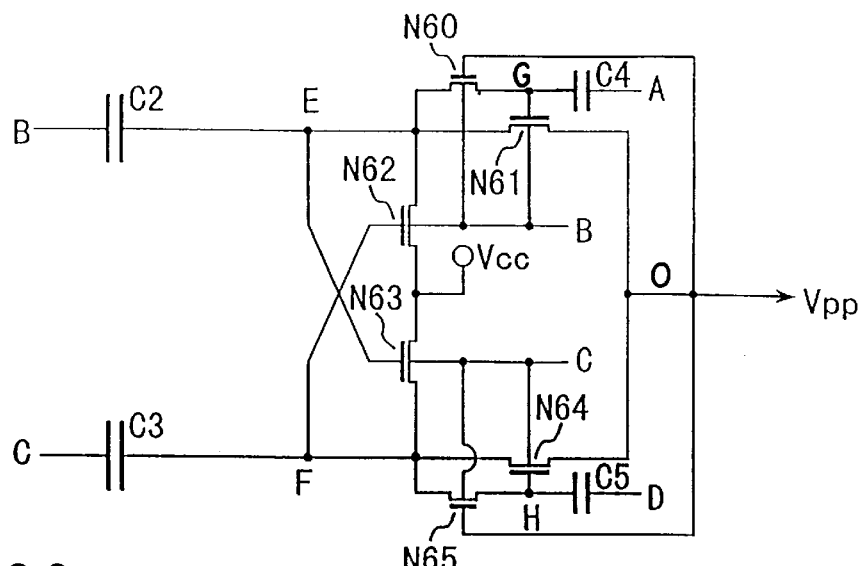
FIG. 29 is a view showing a constitution of a charge pump circuit.
Figure 30:
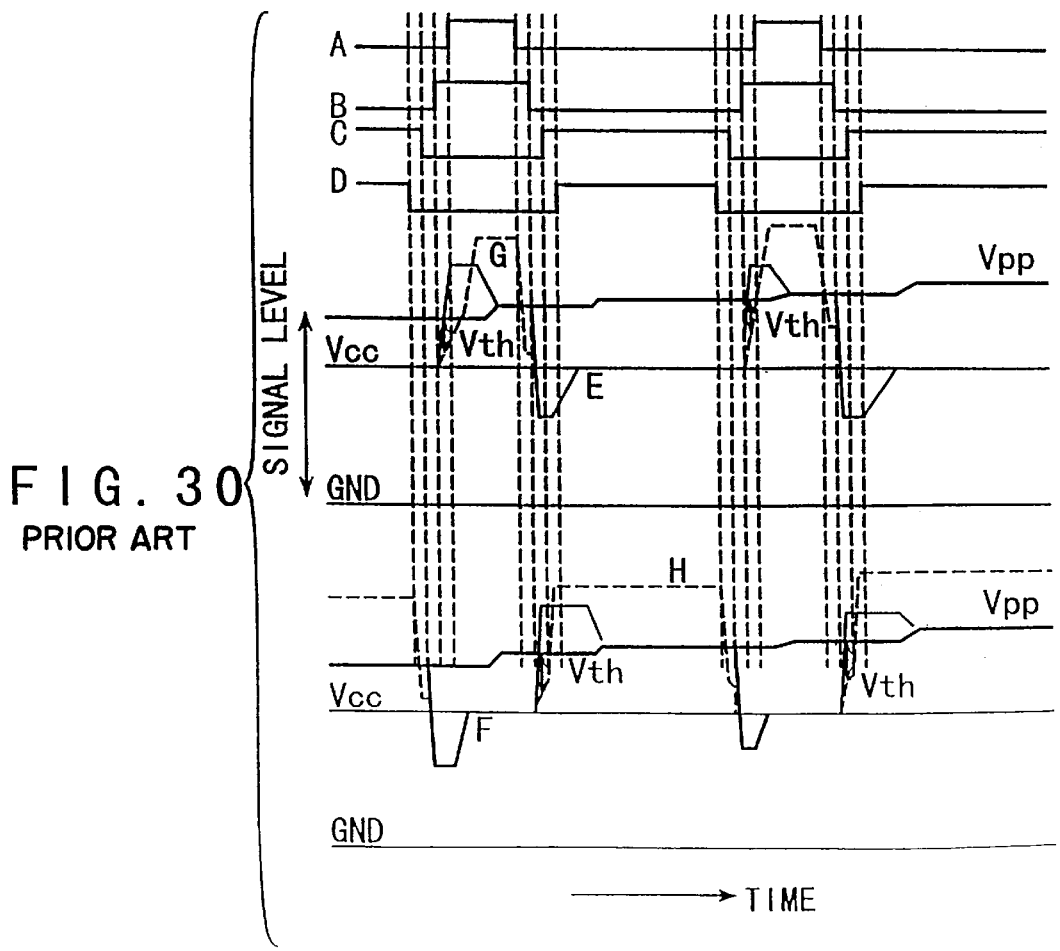
FIG. 30 is a timing chart for illustrating an operation of the charge pump shown in FIG. 29.

Power efficiencies of the boot circuit of the present invention, as shown in FIG. 2, and the pump circuit of FIG. 29 having been shown above will be described. For this purpose, a simplified constitution as shown in FIG. 3 is used.

Figure 3:
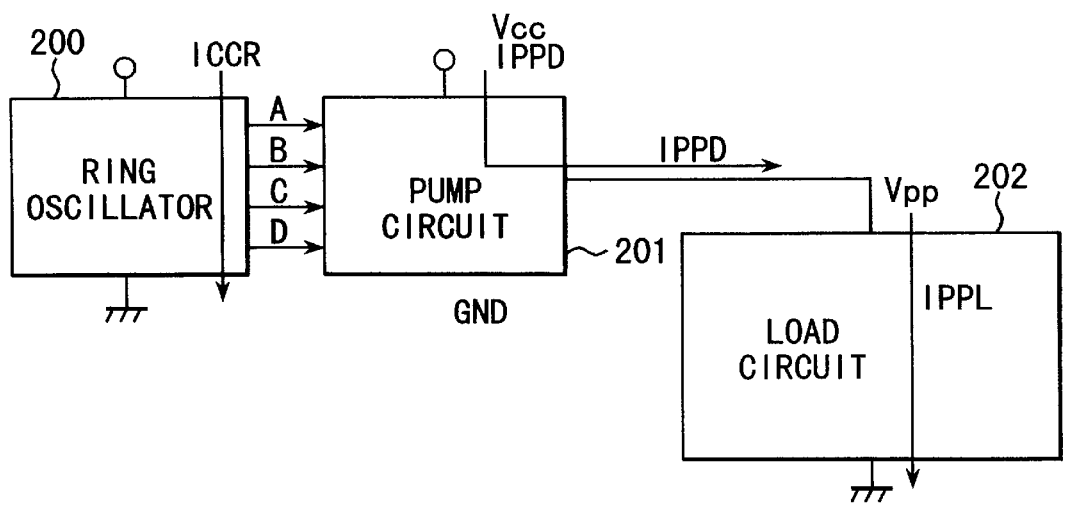
FIG. 3 is a view showing a circuit constitution for considering an efficiency of a conventional Vpp pump circuit.

In FIG. 3, when signal waveforms called A, B, C, D generated in a ring oscillator 200 are input in a pump circuit 201, a current IPPD is generated, this is input in a load circuit 202 (corresponding to a WL driving circuit, an EQL circuit, a Φ T driving circuit or the like) and a level of Vpp is held as a set value when the IPPD is equal to a current IPPL which is consumed in the load circuit 202. At this point, when a current consumed in the ring oscillator 200 is indicated by ICCR, a ratio of IPPD to ICCR is defined as a pump efficiency, that is:

Pump efficiency=IPPD/ICCR, wherein if ICCR=IPPD, the pump efficiency is 1, that is 100%. That ICCR=IPPD means that the above mentioned charge is temporarily stored in an electrode at an end of a large capacitor to which signal waveforms of B and C are input, which also means that the same amount of a charge is stored at an electrode at the other end.

Figure 4:
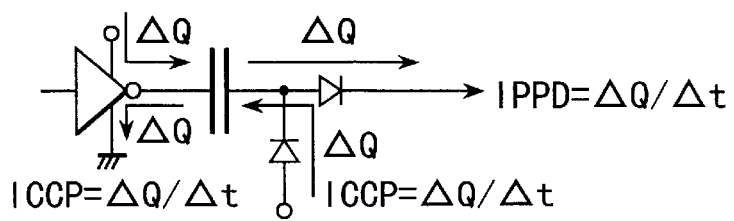
FIG. 4 is a view for illustrating an operation at a 100% efficiency.

That is, it is considered in FIG. 4 that in the case where an operation of the 100% efficiency is performed, a charge of ΔQ is taken in from Vcc in a time of Δt/2 and the charge of ΔQ stored in a capacitor is returned back to the Vpp terminal in a next time of Δt/2, wherein it can be the that not only is such a case expressed as IPPD=ΔQ/Δt, but also this current is equal to either of ICCP and ICCR.

In an actual operation of a pump, it is hard to achieve such an ideal state.

Figure 5:
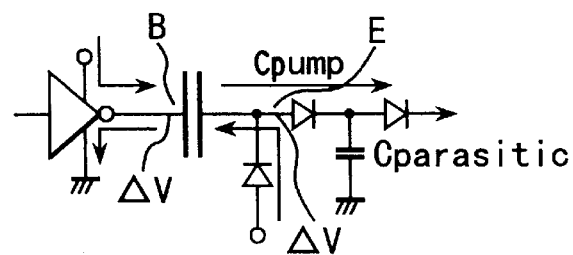
FIG. 5 is a view for illustrating an operation in the case where parasitic capacitances are present.

It is at first considered that not only an intermediate node which is connected with a diode is subjected to pumping by a large capacitor, but a fairly large parasitic capacitance is also attached to the node (see FIG. 5). This is clear from a circuit constitution of the pump circuit of FIG. 29, which had been described above. That is, a capacitance of the gate assumes a very large value since a signal is input to a gate of a first NMOS transistor which forms a path from Vcc in the other side of the pump circuit which acts in a complementarily manner, wherein the NMOS transistor has a quite large width since a sufficiently large current is made to flow. At the same time, capacitances of pn junctions of the source and drain of a second large NMOS transistor which forms paths to the first transistor and Vpp are quite large and thereby an internal node oscillates only with the following Δv even when a node B is oscillated at a voltage ΔV, wherein:

Δv ΔV·Cpump/(Cpump+Cparasitic)

In such a case, even when a charge ΔQ (=Cpump·ΔV) is given or taken out in the node B, an efficiency is reduced since only the following charge Δq is given or taken, wherein:

Δq = Cpump · Δv

= ΔQ · (Cpump + Cparasitic)

In this case, since

IPPD = Δq / Δt

= (ΔQ / Δt) · Cpump / (Cpump + Cparasitic)

= ICCR · Cpump / (Cpump + Cparasitic)

a power efficiency is expressed in the following formula according a defining formula:

Pump power efficiency=Cpump/(Cpump+Cparasitic).

Besides, there are some number of factors which reduce the efficiency. The second reason why is that a signal from the ring oscillator 200 does not singly oscillate a capacitor. With the circuit constitution of a detailed pump circuit shown in FIG. 29, the back gate of an NMOS transistor is subjected to pumping by the nodes B, C. This causes a substrate bias effect to be lowered so that Vth of a NMOS is lowered and as a result, boosting to a sufficiently high level can be achieved even when Vcc is low. Moreover, an auxiliary capacitor is also subjected to pumping by the nodes A, D in order to raise the nodes G, H to a high level. ICCR is larger than a value obtained by calculation with the above formulae by these two factors, which causes an efficiency to be lowered.

The ring oscillator 200 comprises an odd number of inverters which are connected in a ring like shape and a high speed oscillation occurs. For this reason, some number of buffer circuits are necessary in order to take out the nodes A, B, C, D, especially B and C for which a large capacitance is required to be oscillated and some number of logic gates are necessary in order to generate a subtle discrepancy in timing of A, B, C, D as shown in the above mentioned timing chart. Therefore, a considerable amount of power is consumed even in such a circuit and thereby ICCR is further larger.

Figure 6:
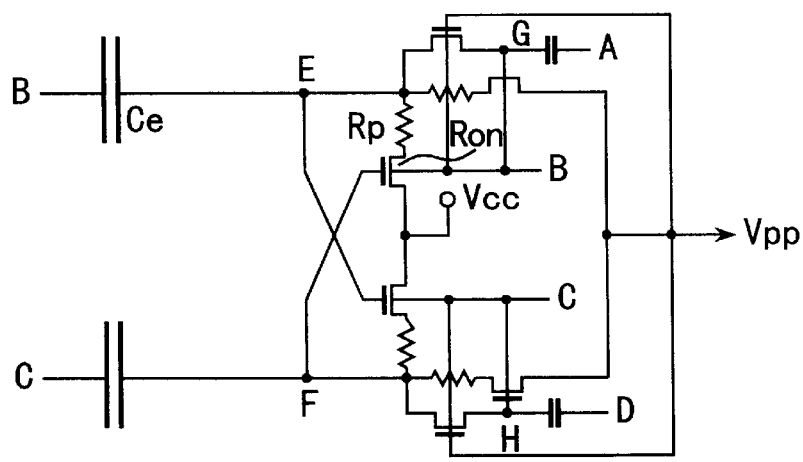
FIG. 6 is a view for illustrating another factor regarding an efficiency of a Vpp pump.

While the above description is focused on reduction in an efficiency required for charge and discharge of a parasitic capacitor or an auxiliary circuit, another important factor which is peculiar to pumping of Vpp will be described in reference to FIG. 6. The important factor is caused by the fact that since IPPL is a very large value in the case of Vpp pump, an oscillating frequency in the ring oscillator is required to be considerably large. An example will be taken up in a concrete manner. In the case of a 64 M DRAM with 4K refresh, IPPD is required to be as large as 14 mA of the same value as IPPL since IPPL=14 mA. At that time, not only does a capacitor have to be designed to be large, but there is also required a very high speed pump operation so that an operating frequency is necessary to be set a very high value, such as tens of MHz to 100 MHz. When a channel resistance of an NMOS transistor which acts as a path form Vcc to the node E is indicated by Ron, a parasitic capacitance of a contact and an interconnect are indicated by Rp and a capacitance of the node E is indicated by Ce, a time τ which is expressed by the following formula is required in order that a charge is provided to the node E from Vcc, wherein:

τ=(Ron+Rp)·Ce

In the case where

τ=(Ron+Rp)·Ce>0.5×fR−1 wherein fR is an oscillating frequency, before all the current to be provided in the capacitor flows into the capacitor, an operation is shifted to a next step, which is also a cause or reduction in efficiency.

As described above, it is understood the Vpp pump circuit is a circuit which has a large minus factor from a view point of a power efficiency.

Why the boot circuit of the type of FIG. 2 is efficient will be described in comparison with the above mentioned pump circuit.

Figure 7:
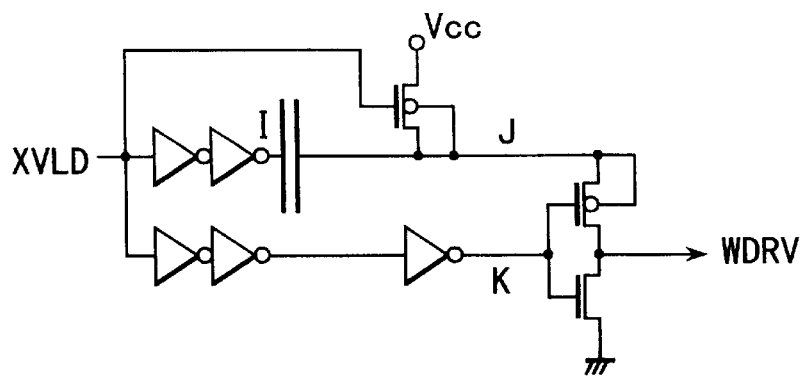
FIG. 7 is a simplified view showing the circuit shown in FIG. 2.

While this circuit has a more or less complex constitution, since this circuit performs decoding of address, a simplified circuit thereof is shown in FIG. 7. Operations of nodes of the circuit are shown in the timing chart of FIG. 8.

Furthermore, this circuit is typically expressed, as shown in FIG. 9, with a capacitor driving circuit 210, a boot circuit 211 and a load circuit 212.

In FIG. 9, a power efficiency of the boot circuit 211 is defined by the following formula:

Efficiency of boot circuit 211=IPPD/ICCD.

On the other hand, if WDRV after booting has been booted 0 volt to Vw volt, according to principle of conservation of charge, $$Vw = Vcc \cdot 2Cp / (Cp + Cload)$$
$$= \eta \cdot Vcc$$

where η is a boot ratio defined by the following formula:

η=2$Cp$/($Cp$+$C$load), where Cload is all the load capacitance for a WDRV signal to drive. Therefore, when a cycle time is tRC, IPPD can be expressed by the following formula:

$$IPPD = Cload \cdot Vcc \cdot 2Cp / (Cp + Cload) \cdot tRC$$
$$= Cload \cdot \eta \cdot Vcc / tRC$$

On the other hand, since a charge flowing in a capacitor of Cp is Cp·Vcc−(η−1)Cp·Vcc, ICCD is expressed by the following formula:

ICCD=$Cp$·$Vcc$·(2−η)/$tRC$

Therefore, a power efficiency of the boot circuit 211 defined by the above formula can be expressed by the following formula:

Power efficiency=($C$load/$Cp$)·η/(2−η)

However, since according to the definition of η,

Power efficiency of boot circuit 211=1 and it is found that the power efficiency is all the time to be 100%.

In a practical case, factors which reduce the efficiency can be considered even in this boot circuit 211. One of them is a factor caused by a parasitic capacitance accompanying a charge transfer path as shown in FIG. 10. A parasitic capacitance of a path portion ahead of WDRV is regarded part of a load capacitance of a wordline and it is considered the parasitic capacitance required for charge. This is the same way of thinking adopted in consideration of Vpp. A calculation of a power efficiency of the boot circuit 211 will again be performed using a constitution of FIG. 10.

Since a boot voltage Vw of WDRV is obtained based on the principle of conservation of charge by the following formula:

($Cp$+$C$parasitic)·$Vcc$=$Cp$·($Vw$−$Vcc$)+$C$load·$Vw$;

Vw=λ·Vcc, where λ is a boot ratio when a parasitic capacitance is present and defined by the following formula:

λ(2$Cp$+$C$parasitic)/($Cp$+$C$load+$C$parasitic)

In this circuit, a drive current IPPD to WDRV is expressed by the following formula:

IPPD=$C$load·λ·$Vcc$/$tRC$, where tRC is a cycle time of wordline driving. Since a current ICCD consumed in the boot circuit 211 is expressed by the following formula, if the current is regarded as a charge/discharge current:

$$ICCD = [Cp \cdot Vcc - (\lambda - 1) \cdot Cp \cdot Vcc] / tRC$$
$$= Cp \cdot Vcc \cdot (2 - \lambda) tRC$$

a power efficiency of the boot circuit under consideration of a parasitic capacitance is expressed by the following formula:

Efficiency of boot circuit 211=IPPD/ICCD=($C$load/$Cp$)·λ(2−λ)

At this point, the definition of λ is given by the following formula:

($C$load/$Cp$)=[2−λ−(λ−1)·ξ]/λ, where ξ is a ratio of a parasitic capacitance to a boot capacitance and ξ=Parasitic/Cp. Therefore, a power efficiency of the boot circuit 211 wherein a parasitic capacitance is considered is expressed by the following formula:

Power efficiency of boot circuit 211=1−ξ·(λ−1)/(2−λ)

In such a manner, if a parasitic capacitance is considered, a power efficiency of the boot circuit 211 is dependent on a boot ratio λ and a ratio ξ of a parasitic capacitance to a boot capacitor. A power ratio of the boot circuit 211 will be compared with a power ratio of the Vpp circuit 201 which has been calculated above. The comparison is made in the cases where only parasitic capacitances of charge transfer paths of both circuits are given consideration with the exception of the other factors.

A power efficiency of the Vpp pump circuit 201 in the case where the circuit is accompanied with a parasitic capacitance, wherein reduction by the other factors are neglected is Power efficiency of the Vpp pump circuit 201=$C$pump/($C$pump+$C$parasitic)

and therefore, the power efficiency is expressed by the following formula with use of the same index ξ:

Power efficiency of Vpp pump=1/(1+ξ)

Figure 11:
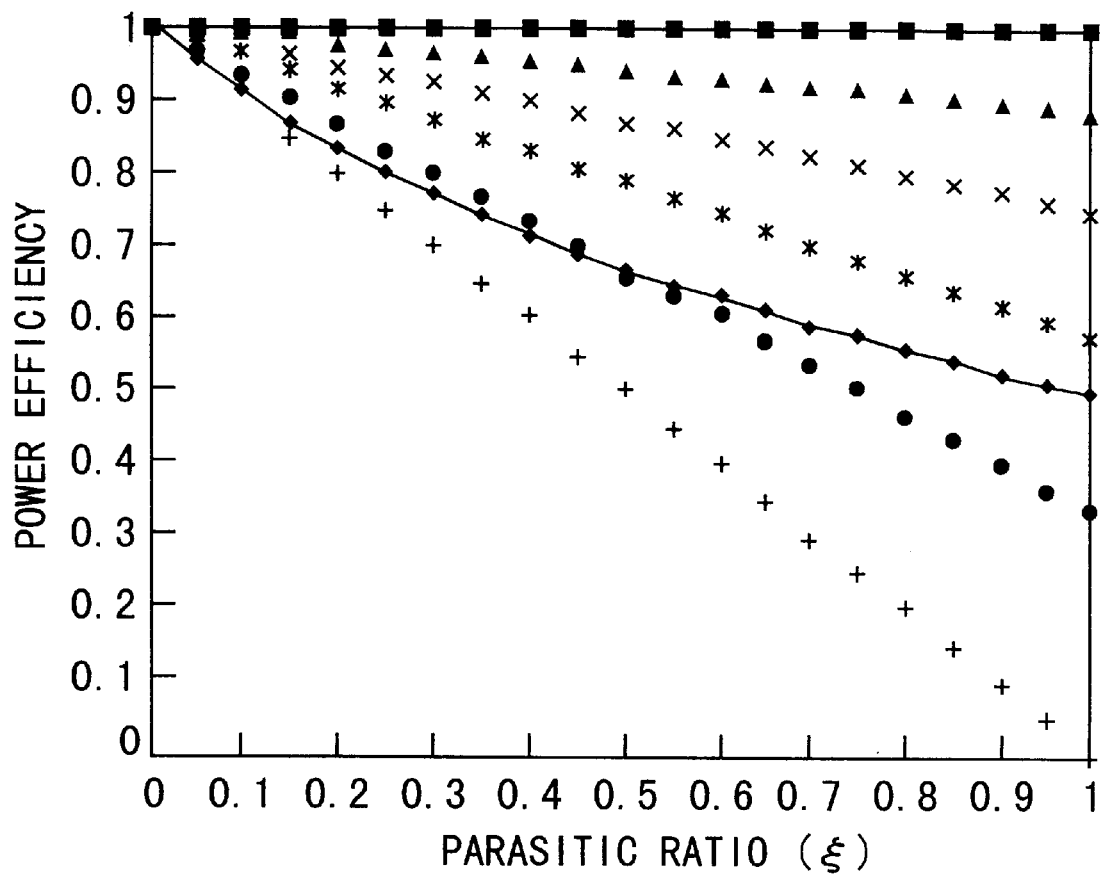
FIG. 11 is a graph showing reduction in efficiency by a parasitic capacitance between boot and pump circuits in a comparative manner.

When the reduction in power efficiency by a parasitic capacitance thus calculated is compared between the cases of the boot circuit 211 and the pump circuit 201, a graph as shown in FIG. 11 is obtained. As can be seen from FIG. 11, while in the case where a boot ratio λ is 1.5 or more, the pump circuit 201 has a better power efficiency than that of the boot circuit 211 over all the range of a parasitic capacitance ratio ξ, in the case where a boot ratio is 1.4 or less and a parasitic capacitance is 0.5 or less which is conceivable in a future DRAM, the boot circuit 211 has always a higher power efficiency than the pump circuit 201. In addition, it can be that parasitic capacitance ratios ξ of both circuits are not the same as each other and the boot circuit 211 has an advantage that it can have a smaller parasitic capacitance than the pump circuit 201. Therefore, a power efficiency of the pump circuit 201 is considerably lower than that of the boot circuit 211.

The above comparison has been made taking account of a parasitic capacitance only and plural other factors are conceivable in regard to the difference in power efficiency between both circuits. A factor is differences in charge/discharge currents of the circuits other than capacitor portions thereof originating from complexity of a circuit constitution. The pump circuit 201 clearly comprises excessive circuits (a ring oscillator, an auxiliary pump and the like), compared with the boot circuit 211 and thereby power is indispensably more required than the boot circuit 211 whose construction is simpler. Moreover, the pump circuit 201 has, as described above, a power loss caused by a parasitic capacitance in a high speed operation at a frequency in the range of tens of MHz to hundred MHz. Since a next operation is performed before a charge is sufficiently stored in a pump, an efficiency cannot be sufficiently increased. On the other hand, the boot circuit 211 is only required to operate in a cycle in which a wordline is driven and thereby it is a circuit where no problem arises basically, if an operation is performed within a RAS cycle of a DRAM. Though a cycle time of a DRAM is progressed toward a higher speed, it is still on the 100 ns (10 MHz) and there is a sufficient margin to complete a circuit operation.

From the above mentioned reason, it is understood that the boot circuit 211 is superior to the pump circuit 201 in terms of power efficiency.

Description has been made on the case where a wordline is driven but a similar circuit is also conceivable in regard to a driving method of a bitline equalization signal and a bitline separation signal (the case of a shared sense amplifier), which has a larger load capacitance than a wordline. In FIG. 12, there are shown bitlines of a shared sense amplifier constitution, sense amplifier (SA) 60, bitline equalization precharge circuits 62, bitline separation circuits 61 and DQ gate circuits 60A. A bitline equalization signal EQL and a bitline separation signal φT are raised to Vcc or higher using a charge stored in a capacitor in a similar manner to the case of a wordline. However, in this case, a three stage decode constitution as in the case of wordline driving is not used but a circuit shown in FIG. 13 is used and only with this circuit, an EQLn signal or a φ Tn signal is driven. The reason why is that the bitline equalization circuit 62 and the bitline separation circuit 61 are different from a wordline and are not required to be packed in an on-pitch part of a cell.

In FIG. 13, an EQL signal is input to the gate of a PMOS transistor P80, an inverter 80 and a NAND circuit 83. The inverter 80 is connected to the drain of the PMOS transistor P80 and the sources of PMOS transistors P81, P82, P83 through another inverter 81 and capacitor 82. The NAND circuit 83 is connected to the gate of an NMOS transistor N80 and the drain of the NMOS transistor N80 is connected to the drain of the PMOS transistor P81 and the gate of the PMOS transistor P82.

The source of the NMOS transistor N80 is connected to the sources of the NMOS transistors N81, N82 and further grounded. The drain of the NMOS transistor N81 is connected to the gate of the PMOS transistor P81, the drain of the PMOS transistor P82, and the common gate of the PMOS transistor P83 and the NMOS transistor N82. The gate of the NMOS transistor N81 is connected to the NMOS transistor N80 through an inverter 81. An EQLn signal or a φTn signal is taken out from the common drain of the PMOS transistor P83 and the NMOS transistor N82.

The constitutions as shown in FIGS. 14 and 15 are also used for a bitline equalization signal EQL and a bitline separation signal φ T instead of the circuit as shown in FIG. 13 and in this case, the constitution basically is the same as in the case of wordline driving.

A way in which an RSLn signal shown in FIGS. 13 and 14 is generated will be described in reference to FIGS. 16 and 17. A RSLn signal means a row block select signal and there is assumed the case where the number is 8 among n=0 to 7. This corresponds to description on the case where a 4 M DRAM is divided into 8 row blocks.

Figure 16:
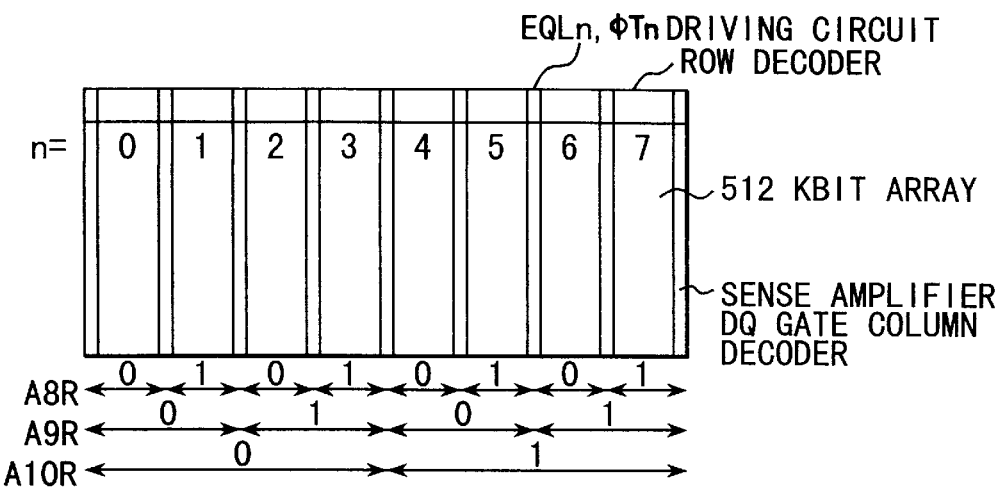
FIG. 16 is a view showing a 4 M DRAM in which a high order of row address A8R, A9R, A10R are allocated.
Figure 17:
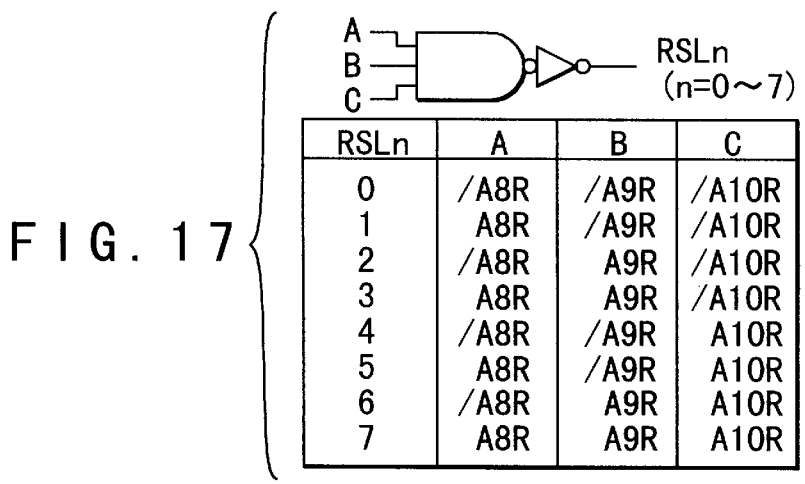
FIG. 17 is a view showing a circuit for generating RSLn and a relation of A, B, C inputs/RSLn outputs.

In a 4 M DRAM as shown in FIG. 16, it is assumed that a high order of row address A8R, A9R, A10R are allocated as shown in the figure. Eight 512-K bitcell arrays are numbered as n=0 to 7 and three row addresses A8R, A9R, A10R select one of them. Therefore, it is understood that a RSLn (n=0 to 7) is generated in a circuit as shown in FIG. 17.

Figure 18:
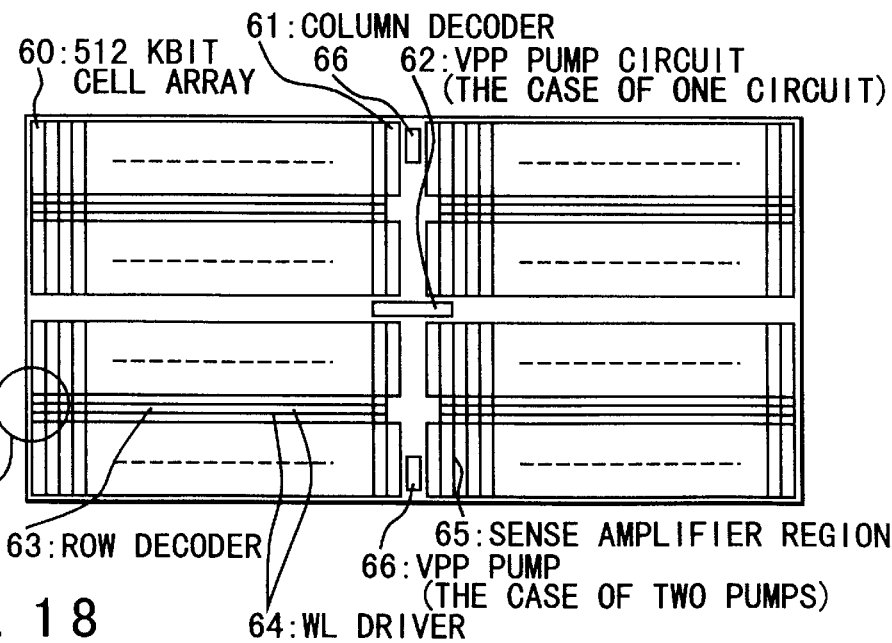
FIG. 18 is a typical view of a layout of a 64 M DRAM comprising one hundred twenty-eight 512-K bit cell arrays.
Figure 19:
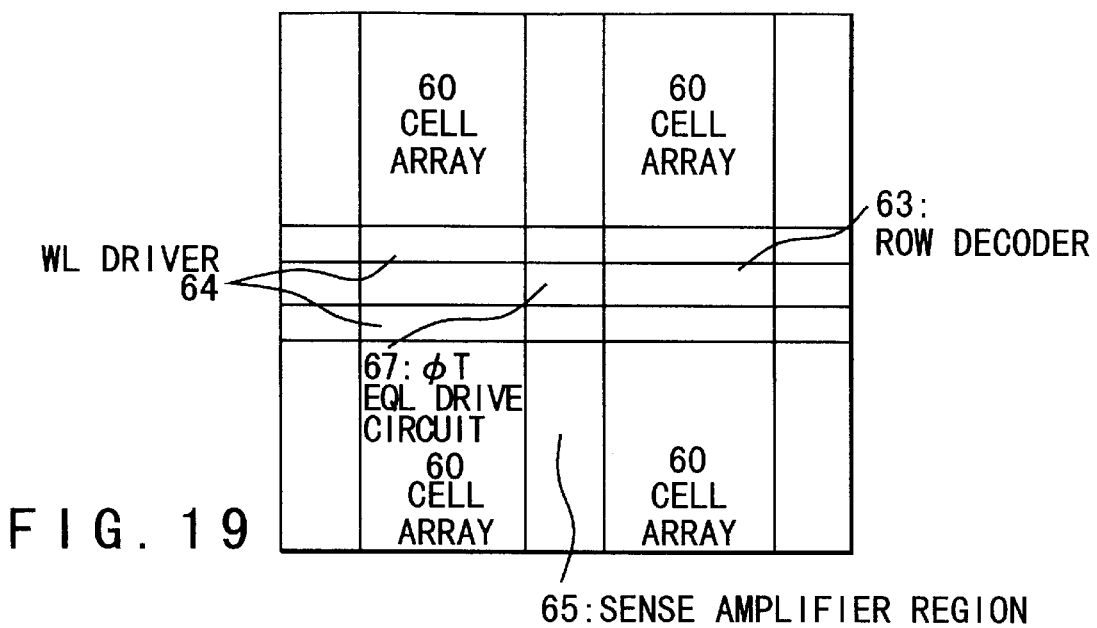
FIG. 19 is an enlarged view showing part of FIG. 18.

FIG. 18 is a typical view of a layout of a 64 M DRAM comprising one hundred twenty-eight (16×8=128) 512-K bit cell arrays. FIG. 19 is an enlarged view showing part marked by A of FIG. 18. As shown in the figure, a sense amplifier region 65 is provided at a boundary of 512 bit cell arrays 60 in a column direction, wherein the sense amplifier region 65 is separated by an NMOS transistor (a reference number 61 of FIG. 12) to the gate of which a bitline separation signal φT is input and commonly used. On the other hand, in a boundary in a row direction, WL drivers 64 are disposed on both edges of a row decoder 63 as a center. A circuit 67 which drives a bitline separation signal φT and a bitline equalization signal EQL is disposed in a region at a crossing of the sense amplifier region 65, a row decoder 63 and a WL driver 64. A Vpp pump circuit 62 is disposed in the center of the chip.

An advantageous point of such a layout is an effect that it is prevented that a voltage of Vpp is changed and an unstable operation is performed depending on a location of cell arrays, in order that current supply of Vpp is symmetrically performed for each of four 16 Mbit mats. In the case where plural Vpp circuits are available, for example two, a similar effect can be obtained by disposing (a reference mark 66) at positions, upper and lower, symmetrical with respect to the center of the chip.

That the sense amplifier region 65 is shared with cell arrays on the sides, left and right, is effective in reduction of chip size.

Since column decoders 61 are disposed in the vicinity of the center in a concentrated manner, a chip size can be reduced. A stacking structure of interconnection constitution is arranged from the bottom in the following manner, which are:

1. polysilicon layer: the gate layer of a wordline
2. tungsten layer: a bitline level
3. aluminum layer in a first level: upper interconnection of a wordline, wherein a wordline and polysilicon lying thereunder is shorted therebetween at several points along the wordline in order to suppress a delay in the wordline. That is, that rise and fall times of a wordline is excessively longer only with polysilicon and thereby not only an access time is slowed but a delay in a wordline is also resulted is suppressed by providing short with the presence of an aluminum layer having a small resistance at proper positions.

4. aluminum layer in a second level: a column select line from a column decoder traverses plural 512 K bit cell arrays on the upper surface, input is performed to a switching transistor between a bitline and a DQ line in each sense amplifier region and thereby read from or write to a cell selected with respect to a pair of bitlines and a pair of DQ lines is performed.

An advantageous point in the case where driving circuits 67 for φT and EQL are disposed in a crossing region of the sense amplifier region 65, the row decoder 63 and the WL driver 64 is that the crossing region can effectively be used to make a chip size smaller by properly disposing a driving circuit for a sense amplifier, that is driving circuits for a SAN bar and a SAP shown in FIG. 12, in the crossing region, which is empty, even if it is considered that the driving circuits can be disposed there.

Besides, though it is not shown in the figure, a row decoder is commonly used for WL drivers disposed on both sides thereof and thereby there is available another effect of shrinkage of a chip size therefrom.

Figure 20A:
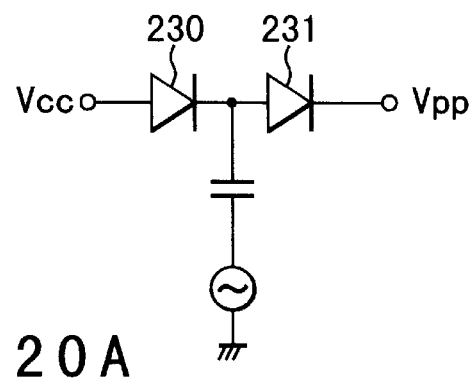
FIGS. 20A to 20C are views showing constitutions of first and second stage booster circuits of a Vpp pump circuit.
Figure 20B:
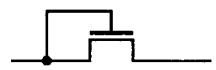

In the case where a Vpp pump circuit itself cannot be operable as a power supply voltage is lowered, an operational margin can be improved to a great extent if diodes 230, 231 are connected in series as shown in FIG. 20A. Instead of the diodes of FIG. 20A, an NMOS transistor, whose gate and drain are connected as shown in FIG. 20B, may be used.

Figure 20C:
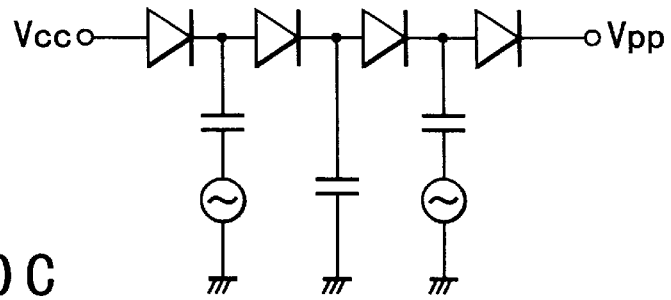

Conventionally, it has been considered that a Vpp pump circuit has a double constitution as shown in FIG. 20C and in the case, a high voltage can be built up even with a diode connection if a multiple constitution is employed, but there arises a problem that a consumed current is increased in proportion to a multiplicity. However, in the embodiment, since a voltage stored in a capacitor is used for driving a wordline with a large load capacitance and a load capacitance of a part where another Vpp is used is sufficiently small, increase in power is not so large, so that the embodiment is evaluated good enough to be practically used, even if a double voltage boosting is adopted as shown in FIG. 20C.

In a boot method, in the case where a WL potential is generated, the WL potential is gradually decreased even due to a weak leakage and has a possibility where a malfunction arises over a long time when a raised voltage is left. Therefore, a leakage compensating circuit will be necessary. This circuit is a very weak pump circuit and the increase in a current is almost zero.

In a synchronous DRAM and the like, it is general that plural banks are provided in a chip and each bank is required to operate independently. Therefore, in such a multibank type DRAM, it is only required that a boot circuit is provided for each bank as shown in FIG. 2. Alternately, a WDRVn of FIG. 21 may be supplied to each bank (n).

In order to shorten a time for a burn-in test, a test-mode in which wordlines are driven in multiplicity is necessary. In such a case, with a conventional Vpp charge pump method, a problem arises in the embodiment though it is no problem that more wordlines than in an ordinarily operation are driven. Therefore, in a driving method of the embodiment, a latch circuit is provided in a row decoder in order to enable an acceleration test so that the same number as an ordinary operation is driven in one time (one cycle), the next cycle is operated while the wordlines already driven are not reset and in such a manner cycles are repeated till plural wordlines are finally driven.

Figure 21:
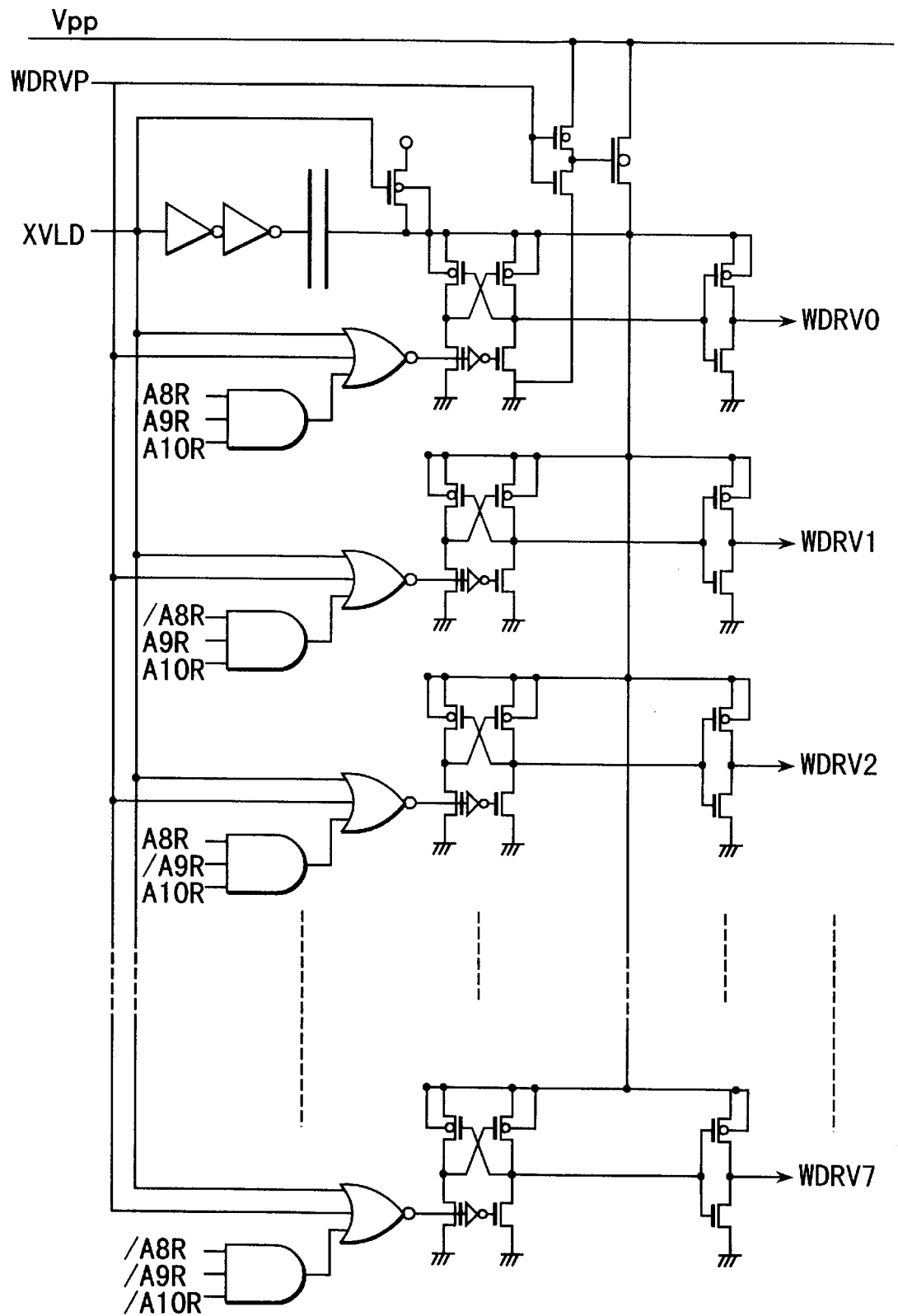
FIG. 21 is a view showing a constitution of a circuit generating a WDRVn signal, which is used in a burn-in test.
Figure 23:
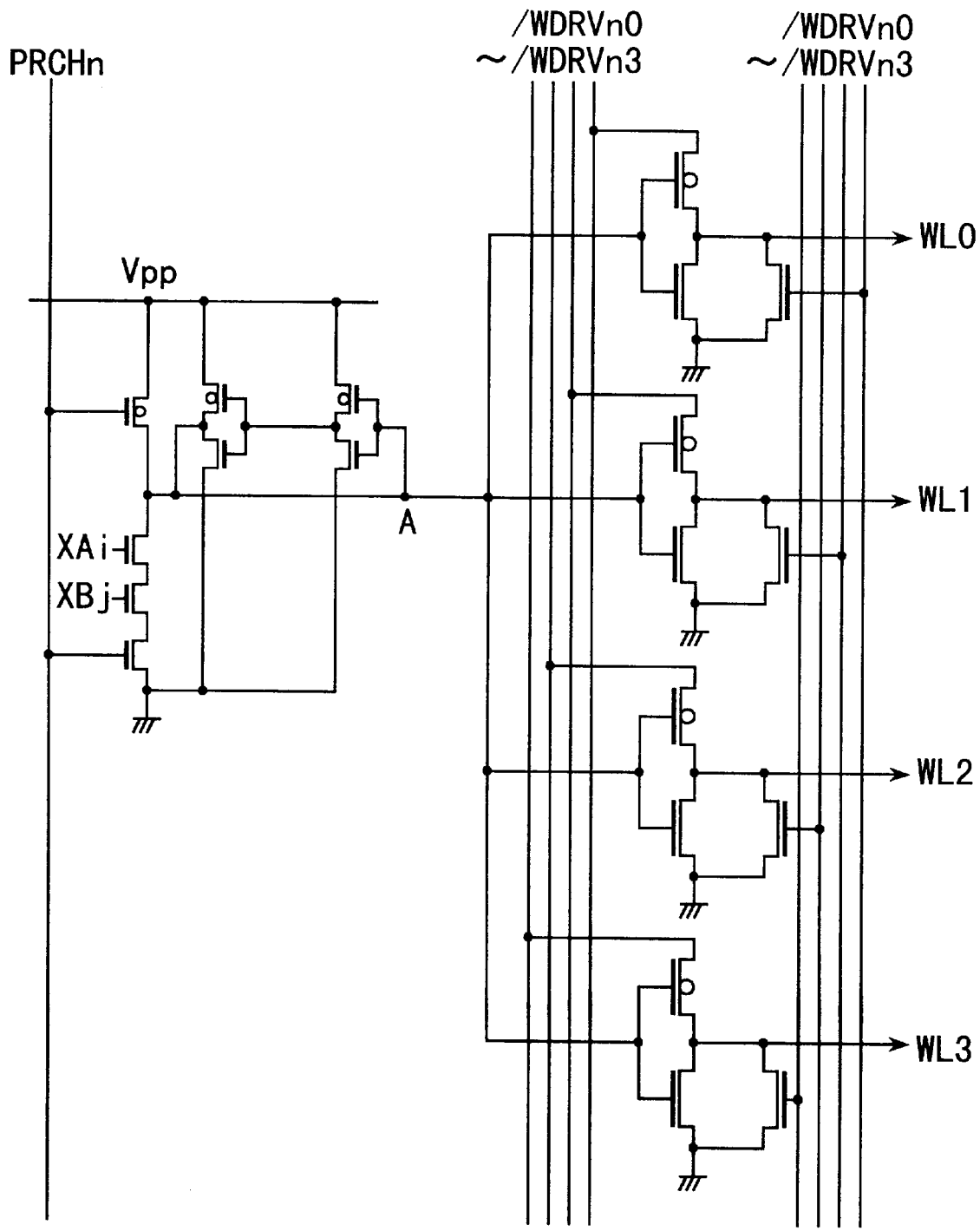
FIG. 23 is a view showing a constitution of a circuit generating a signal for driving a specific wordline, which is used in a burn-in test.
Figure 24:
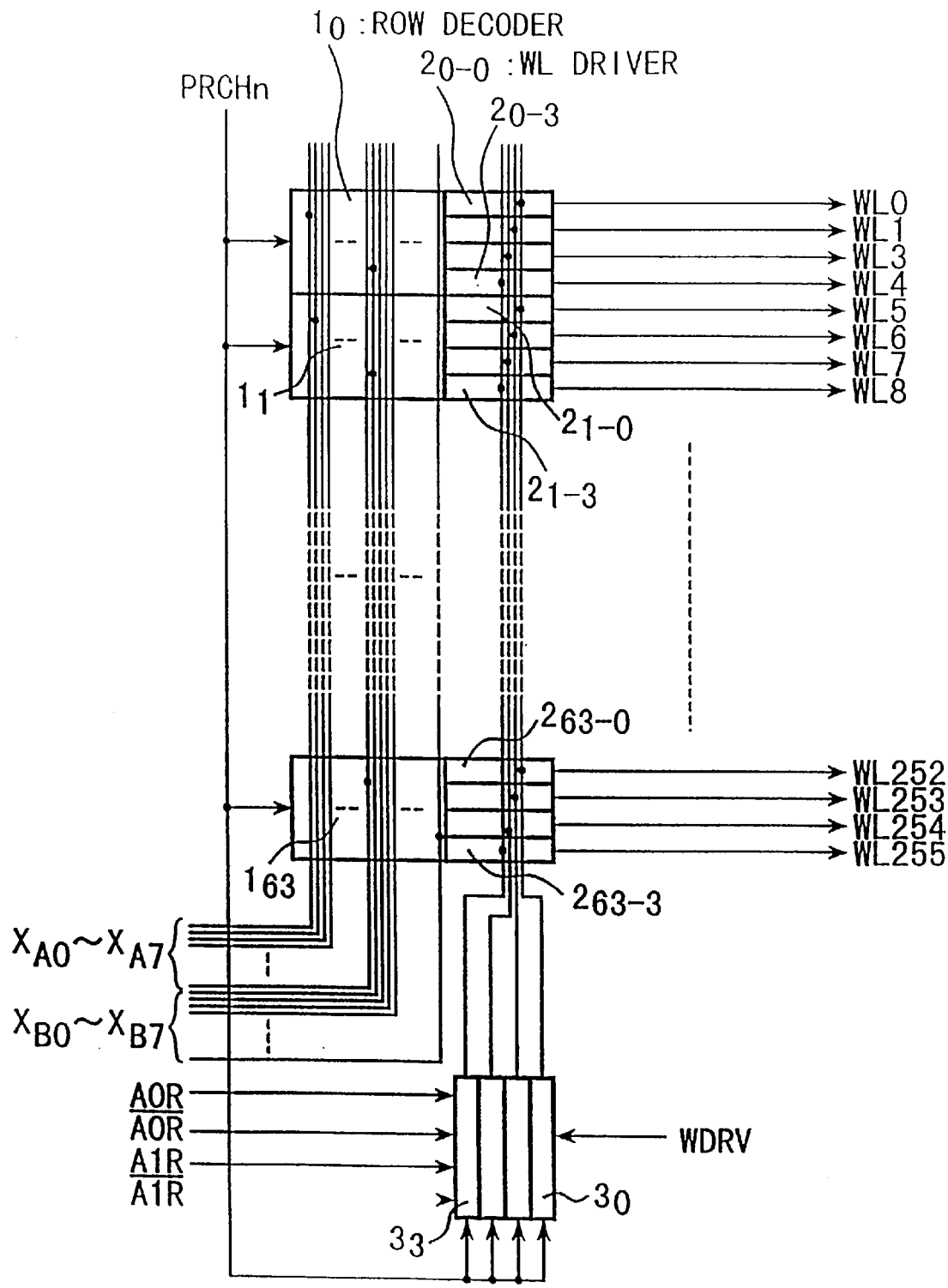
FIG. 24 is view for illustrating an operation in a two stage decoding.
Figure 25:
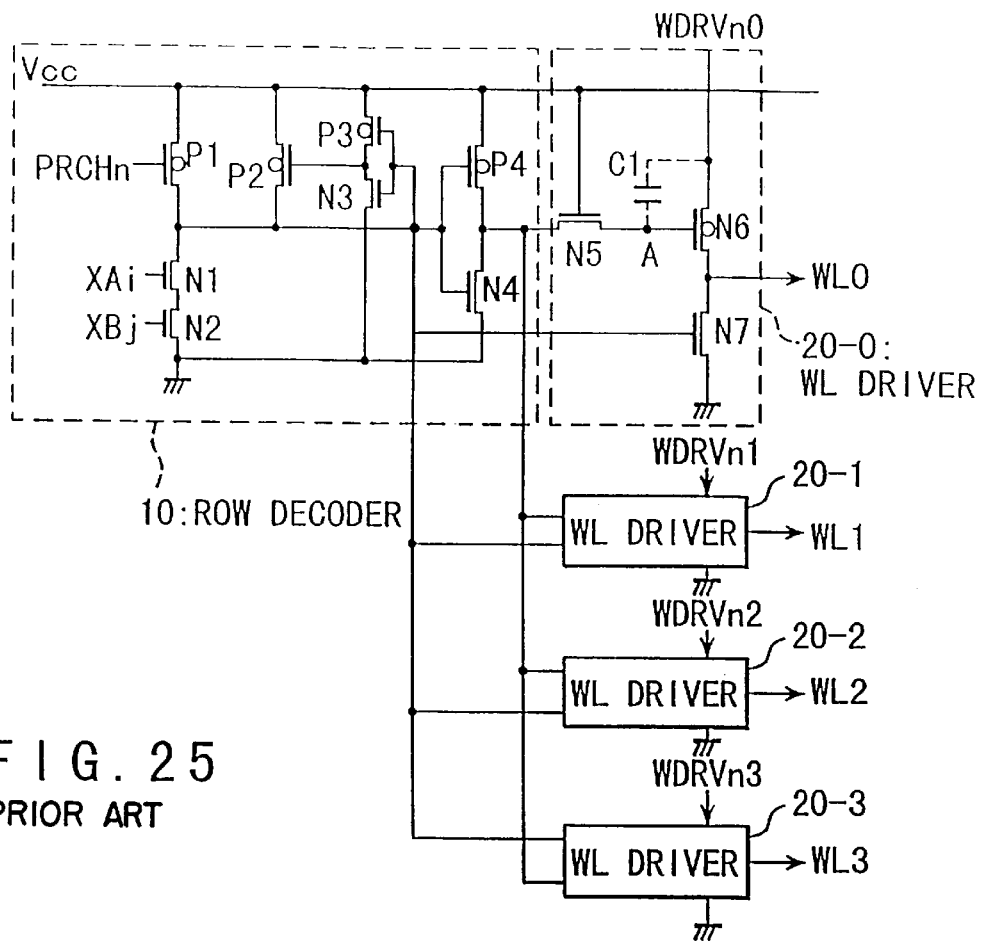
FIG. 25 is a view showing a constitution of a circuit for generating a signal for driving a specified wordline in a row decoder and a WL driver according to a first conventional technique.
Figure 26:
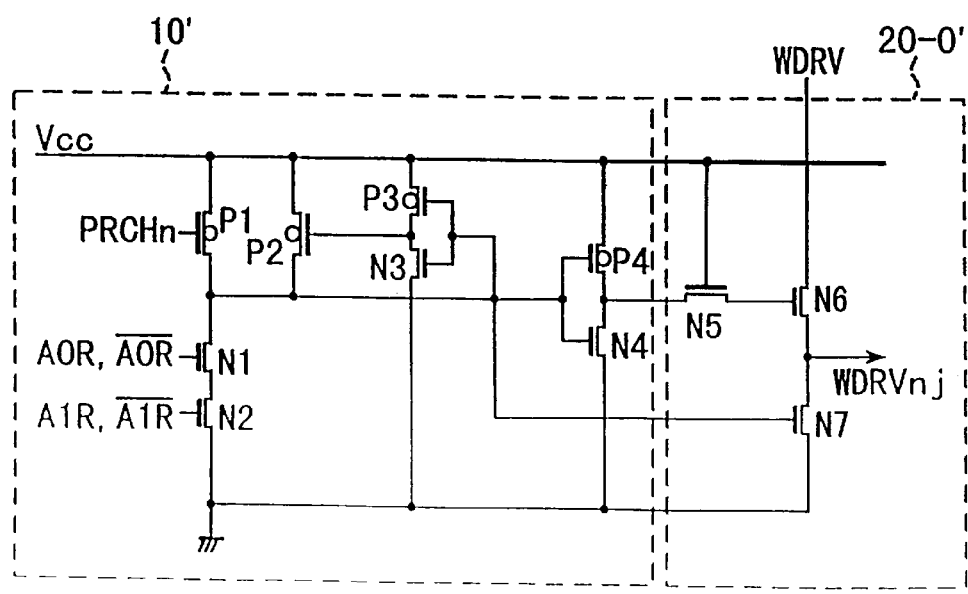
FIG. 26 is a view showing a constitution of a circuit for generating a WDRVnj signal in a row decoder and a WL driver according to the first conventional technique.

This method will be described in a concrete manner. Circuits as shown in FIGS. 21, 22A and 23 are used as a row decoder/WL driver circuit which additionally has a time shortening function in a burn-in test. FIG. 21 corresponds to FIG. 2 which has been mentioned, FIG. 22A corresponds to FIG. 1 which has been mentioned, and FIG. 23 corresponds to FIG. 27,which has been mentioned. When a burn-in test is conducted, RDCLTC and WDRVP are both fixed High. This method is realized in such a manner that /RAS /CAS /WE is controlled at a specific timing (it is not used in an ordinary DRAM operation) and at the same time the address is set at a predetermined value. For example, /RAS is adjusted to a low level in a condition that /WE and /CAS is in a low level and at this point, a mode can be transferred to a shortened time test mode by setting the address or the like. When this mode has been adopted, a signal, which is ordinarily Low, is transferred to High together RDCLTC and WDRVP.

Since WDRVP is high, WDRV0–7 are equal to Vpp. That is, in an ordinary operation mode, if the nodes WDRV0–7 which have been booted to almost the same level as the level of Vpp at a timing when XVLD is high level enter a burn-in shortened time test mode, the node is set to be kept at the level of Vcc all the time. In company with this, /WDRV0–/WDRV7 fall down to the GND level.

At the same time, since RDCLT is High, a precharge signal PRCHn is fixed High. That is, once the nodes A, B at first precharged to a Vpp level is selected by an address signal and fall down to GND, the nodes are never precharged again as far as they are not placed in other conditions than the test.

In this state, if an address signal is input in succession from the outside of the DRAM (or by an address counter in the DRAM), up to four wordlines are successively driven at first. The wordlines thus driven at first maintain their driven conditions without being reset. In a similar way, a second wordline is driven and the first and second wordlines are not reset before a the wordline is driven. Thus up to four wordlines (corresponds to an operation that WDRVn0–WDRVn03 are sequentially driven) are driven one by one. Thereafter, since the WDRVn0–WDRVn03 are already driven and this state is not reset again, then four wordlines corresponding to the selected row decoders are at the same time driven. In such a manner, thereafter four wordlines (corresponding to WDRVn0–WDRVn03) are at one time driven and the wordlines already driven before are never reset. If such operations are repeated, all the wordlines can be driven.

In such a driving method, while it should be admitted with certainty that quite a large number of cycles are required till all the wordlines are driven, since a time for one cycle is in the range of 100 ns to 120 ns, a 256 DRAM requires about 400 μs to 500 μs in order to have all the wordlines which amount to 16384 lines driven in 4099 cycles. Since a stress applied time of a burn-in test for a wordline is equal to or longer than several min, such a rise time can completely be neglected in all the test time.

When a wordline is made to fall after the stress test is finished, if the nodes A, B of the row decoder are in advance precharged, a large current flows into GND and the GND is raised, there is a fear that stored data in a cell is destroyed and it is required that WDRVP is at first adjusted Low and thereby WDRV0–7 are reset by being made to fall to GND while RDCLTC is kept High as it is, wherein in an ordinary burn-in test, since there is no need to keep a cell in a state of storing, such a risk to destroy the stored data is not required to be worried, but in the case where a storing state of a specific cell is tested under a condition of accelerated leakage by driving wordlines with multiplicity, for example, in a disturbance test on a wordline, since there is a need for investigating a storing state of the cell in question after the wordline is reset, it has to be avoided to destroy the cell by resetting the wordline. If the above mentioned operations are adopted, since a current which is used to make a majority of wordlines fall to GND is restricted to a current level, which is allowable for flowing through NMOS, and which makes WDRV0–7 fall to GND, the operations are safe without generating GND noise, though time is consumed more.

According to the above mentioned embodiment, since even when a power supply voltage is lowered to 2.5–1.8V or to a further lower value, sufficiently boosted voltage can be generated in a chip and such a voltage can be supplied to WL, a sufficient charge can be transferred to a cell and a DRAM which has an excellent soft-error resistance and a strong data holding characteristic and a large margin for reading data can be provided.

At the same time, a consumed current can be reduced as compared with a conventional method by a great margin.

Besides, since an operation can sufficiently be performed with a Vcc having a low equalization, a DRAM without a malfunction of a sense amplifier can be provided.

Since a DRAM having a sufficiently high bitline separation signal ΦT in a shared sense amplifier type with a low Vcc can be provided, a shared sense amplifier a stable operation of which is guaranteed even with a low Vcc can be realized and a DRAM of a small chip size can thereby be realized.

If this method is applied to a DRAM of a LSI in which a logic circuit is included in a mixed manner, a system LSI with a memory function, which is operable in a high performance with a low Vcc.

In a method in which a wordline, an EQL line, ΦT and the like are all driven by a conventional Vpp pump, since a large load current flows in Vpp, it is required that a very large smoothing capacitor is provided to a node of Vpp as a load. This is because reduction in Vpp by a large current for an instant is prevented. This capacitor is generally constructed with a layer constituting the gate of an ordinary transistor as an upper electrode and a diffused layer on a Si substrate as a lower electrode and an insulating film of an ordinary transistor as a dielectric, the insulating film is on the order of 80Å in a 256 M DRAM and a capacitance thereof is thousands of pico farads, so that an area of 2×105 to 1×106 $\mu m^2$ is required.

In such a manner, there is a problem that a chip size is larger in order to secure an area for a capacitor. This area amounts to about 10% of the gate area of a transfer gate of a cell in the case of a 256 M DRAM. While a time in which a high electric field (Vpp level) is applied to the cell transfer gate is so limited and thereby a duty ratio is small, since the Vpp voltage is applied all the time in the case of a smoothing capacitor of Vpp, as it were since a duty ratio is 100%, there sometimes is a problematic case in terms of reliability of the insulating film.

As described above, while a conventional system in which a large current flows in Vpp has a problem, since a load capacitance in use of Vpp is by a great margin reduced in the embodiment, there is obtained an effect that a chip area is shrunk to a great extent and a reliability is also improved greatly due to reduction in area of a smoothing capacitor of Vpp to 1/10 of a conventional size.

According to the present invention, there remains a sufficient margin in operation even a power supply voltage is lowered and a DRAM whose consumption of a current is small can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:

plural cell arrays two-dimensionally arranged in column and row directions;

a wordline driving section having a drive transistor in each row for transferring a charge to a corresponding cell in said plural cell arrays by raising a voltage on a wordline selected by a plural stage decode method;

a first generating section for generating a drive signal for driving a wordline which is supplied to said drive transistor, the drive signal being generated based on a stored charge in a capacitor; and a second generating section for generating a control signal for controlling the gate of said drive transistor in a chip of the DRAM device by a charge pump circuit.

2. A semiconductor device comprising:

plural cell arrays two-dimensionally arranged in column and row directions;

a wordline driving section having a drive transistor in each row for transferring a charge to a corresponding cell in said plural cell arrays by raising a voltage on a wordline selected by a plural stage decode method;

a bitline equalization signal driving section in which a bitline equalization signal is generated by raising a voltage;

a first generating section for generating the bitline equalization signal based on a stored charge in a capacitor; and a second generating section for generating a control signal for controlling the gate of said drive transistor in a chip of the DRAM device by a charge pump circuit.

3. A semiconductor device comprising:

plural cell arrays two-dimensionally arranged in column and row directions;

a wordline driving section having a drive transistor in each row for transferring a charge to a corresponding cell in said plural cell arrays by raising a voltage on a wordline selected by a plural stage decode method;

a bitline separation signal driving section for transferring a charge between a bitline and a sense amplifier by raising a voltage of a bitline separation signal;

a first generating section for generating the bitline separation signal based on a stored charge in a capacitor; and a second generating section for generating a control signal for controlling the gate of said drive transistor by a charge pump circuit.

4. A semiconductor device comprising:

plural cell arrays two-dimensionally arranged in column and row directions;

a wordline driving section having a drive transistor in each row for transferring a charge to a corresponding cell in said plural cell arrays by raising a voltage on a wordline selected by a plural stage decode method;

a bitline equalization signal driving section for effecting equalization by raising a voltage of a bitline equalization signal;

a bitline separation signal driving section for transferring a charge between a bitline and a sense amplifier by raising a voltage of a bitline separation signal;

a first generating section for generating a drive signal for driving a wordline which is supplied to said drive transistor, said drive signal being generated based on a stored charge in a capacitor;

a second generating section for generating the bitline equalization signal based on a stored charge in a capacitor;

a third generating section for generating the bitline separation signal based on a stored charge in a capacitor; and a fourth generating section for generating a control signal for controlling the gate of said drive transistor by a charge pump circuit.

5. The semiconductor device according to claim 1, wherein the charge pump circuit comprises two or more charge pump circuits connected in series.

6. The semiconductor device according to claim 2, wherein the charge pump circuit device comprises two or more charge pump circuits connected in series.

7. The semiconductor according to claim 3, wherein the charge pump circuit comprises two or more charge pump circuits connected in series.

8. The semiconductor device according to claim 4, wherein the charge pump circuit comprises two or more charge pump circuits connected in series.

9. The semiconductor device according to claim 1, wherein the wordline driving section is operated in such a manner that in a test mode where said wordlines are driven in a multiplicity, the same number of wordlines as that in an ordinary operation is driven in a first cycle and other wordlines are driven in a second cycle without resetting the wordlines already driven in the first cycle.

10. The semiconductor device according to claim 4, wherein the wordline driving section is operated in such a manner that in a test mode where said wordlines are driven in a multiplicity, the same number of wordlines as that in an ordinary operation is driven in a first cycle and the rest of the wordlines are driven in a second cycle without resetting the wordlines already driven in the first cycle.

11. The semiconductor device according to claim 1, wherein said semiconductor device comprises plural banks each of which a decode control can be independently applied to and each bank being provided with the first generating section.

12. The semiconductor device according to claim 2, wherein said semiconductor device comprises plural banks each of which a decode control can be independently applied to and each bank being provided with the first generating section.

13. The semiconductor device according to claim 3, wherein said semiconductor device comprises plural banks each of which a decode control can be independently applied to and each bank being provided with the first generating section.

14. The semiconductor device according to claim 4, wherein said semiconductor device comprises plural banks each of which a decode control can be independently applied to and each bank being provided with the first generating section.

15. The semiconductor device according to claim 4, wherein said semiconductor device comprises:

one or plural banks which or each of which can be independently decoded; and said first generating section or the same number of first generating sections as that of said plural banks, wherein the wordline drive signal, the bitline equalization signal and the bitline separation signal are supplied to the one or each bank by decode using an address for allocation to each bank in the case of said plural banks.

16. An LSI according to claim 1, wherein the LSI comprises the semiconductor device and a LSI with a logic function, said semiconductor and the LSI being fabricated in the same chip.

17. The semiconductor device according to claim 1, wherein said drive transistor in at least the last row is PMOS, the drive signal generated by said first generating section is supplied to a source of the PMOS and the control signal generated by said second generating section is supplied to other circuits.

18. The semiconductor device according to claim 2, wherein said drive transistor in at least the last row is PMOS, the drive signal generated by said first generating section is supplied to a source of the PMOS and the control signal generated by said second generating section is supplied to other circuits.

19. The semiconductor device according to claim 3, wherein said drive transistor in at least the last row is PMOS, the drive signal generated by said first generating section is supplied to the source of the PMOS and the control signal generated by said second generating section is supplied to other circuits.

20. The semiconductor device according to claim 4, wherein said drive transistor in at least the last row is PMOS, the drive signal generated by the first generating section is supplied to the source of the PMOS and the control signal generated by the second generating section is supplied to other circuits.

21. A semiconductor device comprising:

plural cell arrays two-dimensionally disposed in row and column directions;

a sense amplifier region, which is disposed at a boundary in a column direction of said plural cell arrays, and which is separated by a transistor to a gate of which a bitline separation signal is input and commonly used;

a driver region for a wordline disposed at a boundary in a row direction of said plural cell arrays on both edges of a row decoder as a center;

a driving circuit for driving the bitline separation signal and a bitline equalization signal disposed in a crossing region of said sense amplifier region and said row decoder region;

a first generating section for generating at least one selected from the group consisting of a drive signal for driving said wordline, the bitline separation signal and the bitline equalization signal based on a stored charge in a capacitor; and a second generating section for generating a control signal for controlling a gate of a drive transistor in said driver region by a charge pump circuit.

22. The semiconductor device according to claim 21, wherein said charge pump circuit is disposed almost in the center of a semiconductor chip, on which the semiconductor device is formed.

23. The semiconductor device according to claim 21, wherein plural charge pump circuits are disposed along upper and lower directions from the center of the chip.

24. The semiconductor device according to claim 21, wherein said row decoder is commonly used by the wordline driver region disposed on both edges of the row decoder.

25. The semiconductor device according to claim 1, wherein a circuit of said first generating section comprises:

first and second inverters connected in series with each other to which an original signal is input;

a capacitor; and a CMOS inverter which comprises a first transistor a source of which is connected to a power supply;

a second transistor; and a third transistor, said first, second and third transistors being connected to one another in cascade connection, wherein the original signal is input to a gate of said first transistor, a first end of said capacitor is connected to said first inverter, a second end of said capacitor is connected to a drain of said first transistor and a source of said second transistor, said second inverter is connected to a common gate between said second and third transistors, and a drive signal for driving said wordline is output from a common drain between said second and third transistors.

26. The semiconductor device according to claim 2, wherein a circuit of said first generating section comprises:

a first inverter to which an original signal is input;

a NAND circuit to which the original signal is input;

a first transistor having a source connected to a power supply, and a gate to which the original signal is input;

a capacitor;

second and third transistors having sources connected to each other and a gate of one transistor being connected to a drain of the other transistor;

a fourth transistor having a drain connected to a drain of said second transistor;

a fifth transistor having a drain connected to a drain of said third transistor; and a CMOS inverter comprising sixth and seventh transistors connected to each other in cascade connection;

wherein a first end of said capacitor is connected to said first inverter and a second end of said capacitor is connected to a drain of said first transistor and sources of said second, third and sixth transistors, said NAND circuit is connected to a gate of said fourth transistor and a gate of said fifth transistor through a second inverter, common drain between said third and fifth transistors is connected to a common gate between said sixth and seventh transistors, and a bitline equalization signal is output from a common drain between said sixth and seventh transistors.

27. The semiconductor device according to claim 3, wherein a circuit of said first generating section comprises:

a first inverter to which an original signal is input;

a NAND circuit to which the original signal is input;

a first transistor having a source connected to a power supply;

a capacitor;

second and third transistors having sources connected to each other and a gate of one transistor being connected to a drain of the other transistor;

a fourth transistor having a drain connected to a drain of said second transistor;

a fifth transistor having a drain connected to a drain of said third transistor;

a second inverter connected to said fourth and fifth transistors; and a CMOS inverter comprising sixth and seventh transistors connected to each other in cascade connection;

wherein a first end of said capacitor is connected to said first inverter, a second end of said capacitor is connected to a drain of said first transistor and sources of said second, third and sixth transistors, said NAND circuit is connected to a gate of said fourth transistor, a common drain between said third and fifth transistors is connected to a common gate between said sixth and seventh transistors, and a bitline separation signal is output from a common drain between said sixth and seventh transistors.

28. The semiconductor device according to claim 26, wherein a row block select signal for selecting one row block among plural row blocks is input to said NAND circuit, said row block select signal being generated based on a combination of plural row addresses.

29. The semiconductor device according to claim 27, wherein a row block select signal for selecting one row block among plural row blocks is input to said NAND circuit, said row block select signal being generated based on a combination of plural row addresses.

* * * * *